United States Patent
Matsuzaki

(10) Patent No.: US 7,154,799 B2
(45) Date of Patent: Dec. 26, 2006

(54) SEMICONDUCTOR MEMORY WITH SINGLE CELL AND TWIN CELL REFRESHING

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 11/098,557

(22) Filed: Apr. 5, 2005

(65) Prior Publication Data

US 2005/0190625 A1    Sep. 1, 2005

Related U.S. Application Data

(63) Continuation of application No. PCT/JP03/05285, filed on Apr. 24, 2003.

(51) Int. Cl.
G11C 7/00    (2006.01)

(52) U.S. Cl. .................. 365/222; 365/131; 365/230.03

(58) Field of Classification Search ........... 365/185.08, 365/185.11, 202, 222, 230.03, 131
See application file for complete search history.

(56) References Cited

U.S. PATENT DOCUMENTS

| | | | | |
|---|---|---|---|---|
| 5,875,143 | A | * | 2/1999 | Ben-Zvi ..................... 365/222 |
| 6,160,738 | A | * | 12/2000 | Atsumi et al. .......... 365/185.25 |
| 6,449,204 | B1 | | 9/2002 | Arimoto et al. |
| 6,515,929 | B1 | * | 2/2003 | Ting et al. ................... 365/222 |
| 6,829,192 | B1 | * | 12/2004 | Shinozaki et al. .......... 365/222 |

FOREIGN PATENT DOCUMENTS

| | | |
|---|---|---|
| JP | 2000-298982 | 10/2000 |
| JP | 2001-143463 | 5/2001 |
| JP | 2002-93165 | 3/2002 |
| JP | 2002-170386 | 6/2002 |
| JP | 2002-184181 | 6/2002 |
| JP | 2003-273245 | 9/2003 |

* cited by examiner

Primary Examiner—Anh Phung
Assistant Examiner—Alexander Sofocleous
(74) Attorney, Agent, or Firm—Arent Fox, PLLC.

(57) ABSTRACT

Flags are formed to respectively correspond to memory cell groups each including volatile memory cells. Each flag indicates as a set state that the memory cells store data in a second memory mode. In a changing operation of changing from a first memory mode in which data is independently retained by each memory cell to a second memory mode in which same data are retained in the memory cells of each memory cell group, each flag is reset in response to the first access to the corresponding memory cell group. Therefore, only the first access is made in the second memory mode in each memory cell group. The memory cells are accessed in a mode according to the flag in the changing operation, thereby allowing a system managing the semiconductor memory to freely access the memory cells even during the changing operation. Consequently, a practical changing time can be eliminated.

11 Claims, 43 Drawing Sheets

MODE3="H"

| REFAD | | | | | | | | | | | | | | | |
|---|---|---|---|---|---|---|---|---|---|---|---|---|---|---|---|
| R5 | R4 | R3 | R2 | R1 | R0 | | | | | | | | | | |
| 0 | 0 | 0 | 0 | 0 | 0 | | | | | | | | | | |
| 0 | 0 | 0 | 0 | 1 | 0 | | | | | | | | | | |
| 0 | 0 | 0 | 1 | 0 | 0 | | | | | | | | | | |
| 0 | 0 | 0 | 1 | 1 | 0 | | | | | | | | | | |
| 0 | 0 | 1 | 0 | 0 | 0 | | | | | | | | | | |
| 0 | 0 | 1 | 0 | 1 | 0 | | | | | | | | | | |
| 0 | 0 | 1 | 1 | 0 | 0 | | | | | | | | | | |
| 0 | 1 | 1 | 1 | 1 | 0 | | | | | | | | | | |
| 0 | 1 | 1 | 0 | 0 | 0 | | | | | | | | | | |
| ------- | | | | | | | | | | | | | | | |
| 1 | 1 | 1 | 0 | 1 | 0 | | | | | | | | | | |
| 1 | 1 | 1 | 1 | 0 | 0 | | | | | | | | | | |
| 1 | 1 | 1 | 1 | 1 | 0 | | | | | | | | | | | count up →

MODE1="H" or MODE2="H"

| REFAD | | | | | | |
|---|---|---|---|---|---|---|
| R5 | R4 | R3 | R2 | R1 | R0 | |
| 0 | 0 | 0 | 0 | 0 | 0 | |
| 0 | 0 | 0 | 0 | 0 | 1 | |
| 0 | 0 | 0 | 0 | 1 | 0 | |
| 0 | 0 | 0 | 0 | 1 | 1 | |
| 0 | 0 | 0 | 1 | 0 | 0 | |
| 0 | 0 | 0 | 1 | 0 | 1 | |
| 0 | 0 | 0 | 1 | 1 | 0 | |
| 0 | 0 | 1 | 1 | 0 | 1 | |
| 0 | 0 | 1 | 0 | 0 | 1 | |
| ------- | | | | | | |
| 1 | 1 | 1 | 0 | 0 | 1 | |
| 1 | 1 | 1 | 1 | 1 | 0 | |
| 1 | 1 | 1 | 1 | 1 | 1 | | count up →

Fig. 8

MODE1="H" or MODE2="H"

| REFAD | | | | | | | | | | | | | | |
|---|---|---|---|---|---|---|---|---|---|---|---|---|---|---|
| R5 | R4 | R3 | R2 | R1 | R0 | | | | | | | | | |
| 0 | 0 | 0 | 0 | 0 | 0 | | | | | | | | | |
| 0 | 0 | 0 | 0 | 0 | 1 | | | | | | | | | |
| 0 | 0 | 0 | 0 | 1 | 0 | | | | | | | | | |
| 0 | 0 | 0 | 0 | 1 | 1 | | | | | | | | | |
| 0 | 0 | 0 | 1 | 0 | 0 | | | | | | | | | |
| 0 | 0 | 0 | 1 | 0 | 1 | | | | | | | | | |
| 0 | 0 | 0 | 1 | 1 | 0 | | | | | | | | | |
| 0 | 0 | 1 | 1 | 1 | 1 | | | | | | | | | |
| 0 | 0 | 1 | 0 | 0 | 0 | | | | | | | | | |
| ⋯ | ⋯ | ⋯ | ⋯ | ⋯ | ⋯ | | | | | | | | | |
| 1 | 1 | 1 | 1 | 0 | 1 | | | | | | | | | |
| 1 | 1 | 1 | 1 | 1 | 0 | | | | | | | | | |
| 1 | 1 | 1 | 1 | 1 | 1 | | | | | | | | | | count up →

MODE3="H"

| REFAD | | | | | |
|---|---|---|---|---|---|
| R5 | R4 | R3 | R2 | R1 | R0 |
| 0 | 0 | 0 | 0 | 0 | 0 |
| 0 | 0 | 0 | 1 | 0 | 0 |
| 0 | 0 | 1 | 0 | 0 | 0 |
| 0 | 0 | 1 | 1 | 0 | 0 |
| 0 | 1 | 0 | 0 | 0 | 0 |
| 0 | 1 | 0 | 1 | 0 | 0 |
| 0 | 1 | 1 | 0 | 0 | 0 |
| 0 | 1 | 1 | 1 | 0 | 0 |
| 1 | 0 | 0 | 0 | 0 | 0 |
| ⋯ | ⋯ | ⋯ | ⋯ | ⋯ | ⋯ |
| 1 | 1 | 0 | 1 | 0 | 0 |
| 1 | 1 | 1 | 0 | 0 | 0 |
| 1 | 1 | 1 | 1 | 0 | 0 | count up →

Fig. 35

SEMICONDUCTOR MEMORY WITH SINGLE CELL AND TWIN CELL REFRESHING

CROSS-REFERENCE TO RELATED APPLICATIONS

This application is a continuation application of PCT International Patent Application No. PCT/JP03/05285, filed on Apr. 24, 2003, the entire contents of which are incorporated herein by reference.

BACKGROUND OF THE INVENTION

1. Field of the Invention

The present invention relates to a semiconductor memory requiring a refresh operation for retaining data written to its memory cells.

2. Description of the Related Art

A memory capacity required for a hand-held terminal such as a cellular phone is increasing year by year. Under such circumstances, a dynamic RAM (hereinafter, referred to as a DRAM) has come into use as a work memory of the hand-held terminal in place of a conventional static RAM (hereinafter, referred to as a SRAM). Since the DRAM has a smaller number of elements constituting a memory cell than the SRAM, its chip size can be made smaller and its chip cost can be made lower than those of the SRAM.

Meanwhile, power consumption of a semiconductor memory mounted on a cellular phone has to be low in order to allow long battery duration. Unlike the SRAM, the DRAM needs periodical refresh operations in order to retain data written to its memory cells. Therefore, the hand-held terminal using the DRAM as its work memory consumes power only for retaining data even when it is not in use, so that a battery is consumed.

In order to reduce power consumption of a DRAM in a standby state (in a low power consumption mode), a partial refresh technology and a twin cell technology have been developed. The partial refresh technology is disclosed in Japanese Unexamined Patent Application Publication No. 2000-298982. The twin cell technology is disclosed in Japanese Unexamined Patent Application Publication No. 2001-143463.

The partial refresh technology limits memory cells that are to retain data in a standby state, thereby decreasing the number of memory cells to be refreshed. The decrease in the number of the memory cells to be refreshed decreases the number of times of refresh operations, so that standby power consumption can be reduced.

In the twin cell technology, two memory cells (memory cell pair) respectively connected to complementary bit lines store complementary data, so that an amount of electric charges retained by the memory cell pair is doubled. Since the two memory cells retain "H" data and "L" data, respectively, a refresh cycle is determined by the longer one of the data retention times of the "H" data and the "L" data. This means that the worst data retention time is not a characteristic of one memory cell but is the sum of the characteristics of the two memory cells. On the other hand, the refresh cycle in a single memory cell is determined by the shorter one of the data retention times of the "H" data and the "L" data. Thus, the twin cell technology uses two memory cells for retaining data, so that even if one of the memory cells has a minute leak path, the other memory cell can compensate for this.

SUMMARY OF THE INVENTION

It is an object of the present invention to reduce power consumption for retaining data in a semiconductor memory having volatile memory cells.

It is another object of the present invention to realize a quick change from an operation mode for holding data to a mode for accessing data.

According to one of the aspects of the semiconductor memory of the present invention, each of a plurality of memory cell groups is constituted of a plurality of volatile memory cells connected to a predetermined number of word lines, respectively. A control circuit executes operations of a first memory mode and a second memory mode, the first memory mode being a mode in which each of the memory cells independently retains data and the second memory mode being a mode in which the memory cells in each of the memory cell groups retain the same data. The second memory mode is a mode in which a so-called partial technology and twin cell technology are combined, and in this mode, the data retained in the first memory mode is partly retained by the plural memory cells. Therefore, the data retention time of the memory cells in the second memory mode is longer than that in the first memory mode. As a result, the frequency of refreshing the memory cells can be greatly lowered, which can reduce power consumption.

Each of a plurality of flags formed to correspond to the respective memory cell groups indicates as a set state that the memory cells store data in the second memory mode. In a changing operation of changing a state of all the memory cells from the second memory mode to the first memory mode, a flag reset circuit resets the flag in response to a first access to the corresponding memory cell group. This ensures that the first access to each of the memory cell groups is executed in the second memory mode.

In the second memory mode, the plural memory cells store the same data, so that a refresh cycle is lengthened, which may possibly reduce a stored amount per memory cell (for example, an amount of electric charges) compared with that in the first memory mode. Therefore, there is a risk that the data may be lost if the first access is executed in the first memory mode in the changing operation. The execution of the first access in the second memory mode can prevent data in the accessed memory cell from being lost.

The flag is formed for each memory cell group which is a unit of an access in the second memory mode. This makes it possible to judge for each accessed memory cell in which mode the memory cell retains data. In other words, this allows the concurrent existence of the memory cell retaining data in the second memory mode and the memory cell retaining data in the first memory mode during the changing operation. A system managing the semiconductor memory is allowed to freely access the memory cell even during the changing operation if accessing the memory cell in a mode in compliance with the flag during the changing operation. As a result, a practical changing time can be eliminated.

According to another mode of the semiconductor memory of the present invention, a flag set circuit sets all the flags prior to the changing operation. This ensures that the memory cells of all the memory cell groups shift from the second memory mode to the first memory mode.

According to still another mode of the semiconductor memory of the present invention, when the memory cell is accessed, a flag detection circuit detects whether or not the corresponding flag is set. The control circuit executes the operation of one of the first memory mode and the second memory mode according to a result of the detection by the flag detection circuit. Detecting the state of the flag by the flag detecting circuit can facilitate the operation of the control circuit, so that its circuitry can be simplified.

According to yet another mode of the semiconductor memory of the present invention, when the first access is a write operation, the control circuit reads data from all the memory cells of the selected memory cell group to write back the read data to all the memory cells of the selected memory cell group. That is, the data retained in the second memory mode are written back to the plural memory cells in the second memory mode again. Owing to the write back of the data, the data are firmly written to the memory cells. Thereafter, data is written to the memory cell designated as a write target. That is, the data is written to the designated memory cell in the first memory mode. The memory cell in the memory cell group that is not designated as the write target retains the original data. Therefore, even when a write instruction to one of the memory cells retaining data in the second memory mode, is given, it is possible to retain the new write data in a predetermined memory cell without any loss of the original data. Thereafter, a refresh operation is executed at a refresh cycle of the first memory mode, so that the data can be read from any of the memory cells even when the next access thereto is executed in the first memory mode. As a result, the system need not wait when executing a write operation even during the changing operation.

According to yet another mode of the semiconductor memory of the present invention, a sense amplifier is connected to the memory cells via bit lines. The control circuit keeps the sense amplifier activated while data is read from, written back to, and written to the memory cells. Therefore, it is possible to lower the frequency of activating the sense amplifier to shorten the time required for the write operation.

According to yet another mode of the semiconductor memory of the present invention, in the write operation, a word control circuit makes the word line unselected while the sense amplifier is activated, the word line being connected to the memory cell in the memory cell group except the memory cell designated as the write target. The write data is not transmitted to the memory cell connected to the unselected word line. Therefore, with a simple control, it is possible to execute the data write-back operation in the second memory mode and the data write operation in the first memory mode while the sense amplifier is activated.

According to yet another mode of the semiconductor memory of the present invention, when the first access is a read operation, the control circuit reads data from all the memory cells of the memory cell group to output the read data to an external part of the semiconductor memory and writes back the read data to the memory cells. That is, the data retained in the second memory mode is written back to the plural memory cells in the second memory mode again. Therefore, the system need not wait when executing the read operation even during the changing operation.

According to yet another mode of the semiconductor memory of the present invention, when the first access is a refresh operation, the control circuit reads data from all the memory cells in the selected memory cell group to write back the read data to the memory cells. That is, the data retained in the second memory mode is written back to the plural memory cells in the second memory mode again. Since the flag is reset in response to the first access, each of the memory cells in the memory cell group thereafter operates in the first memory mode. Owing to the refresh operation of writing back the data, the data is firmly written to each of the memory cells to which a refresh access is made, and a subsequent refresh operation is executed at a refresh cycle of the first memory mode. Consequently, even when each of the memory cells is accessed in the first memory mode thereafter, it is possible to surely read or refresh the data.

According to yet another mode of the semiconductor memory of the present invention, the semiconductor memory has: a normal operation mode in which the semiconductor memory operates according to an externally supplied access command and an internally generated refresh command; and a data retention mode in which the semiconductor memory operates according only to the refresh command. Data is stored in the first memory mode during the normal operation mode, and is stored in the second memory mode during the data retention mode. A system to which the present invention is applied is capable of accessing the semiconductor memory immediately after the shift from the data retention mode to the normal operation mode even when the memory cell in the first memory mode and the memory cell in the second memory mode concurrently exit. That is, the system can be operated at high speed.

According to yet another mode of the semiconductor memory of the present invention, the memory cells of the memory cell group include a partial memory cell storing data that is retained during the second memory mode. After the shift from the normal operation mode to the data retention mode, the control circuit executes, every time the refresh command is generated, a common refresh operation of reading data stored in the partial memory cell to write the read data to all of the memory cells of the memory cell group until the states of all the memory cell groups shift to the second memory mode. By the common refresh operation, the data stored in the partial memory cell in the first memory mode can be stored in the second memory mode in the memory cells of the memory cell group. The state of the memory cells in the first memory mode is converted to the second memory mode every time the refresh operation is executed, which enables efficient change from the normal operation mode to the data retention mode.

According to yet another mode of the semiconductor memory of the present invention, the single memory cell connected to the single word line retains one-bit data in the first memory mode. All the memory cells of the memory cell group retain one-bit data in the second memory mode. This makes it possible to easily access the memory cells in the first memory mode or the second memory mode by selecting the single word line or the plural word lines.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 8 is an explanatory chart showing operations of the refresh address counter shown in FIG. 6;

FIG. 35 is an explanatory chart showing operations of the refresh address counter shown in FIG. 34;

DESCRIPTION OF THE PREFERRED EMBODIMENTS

Figure 1:
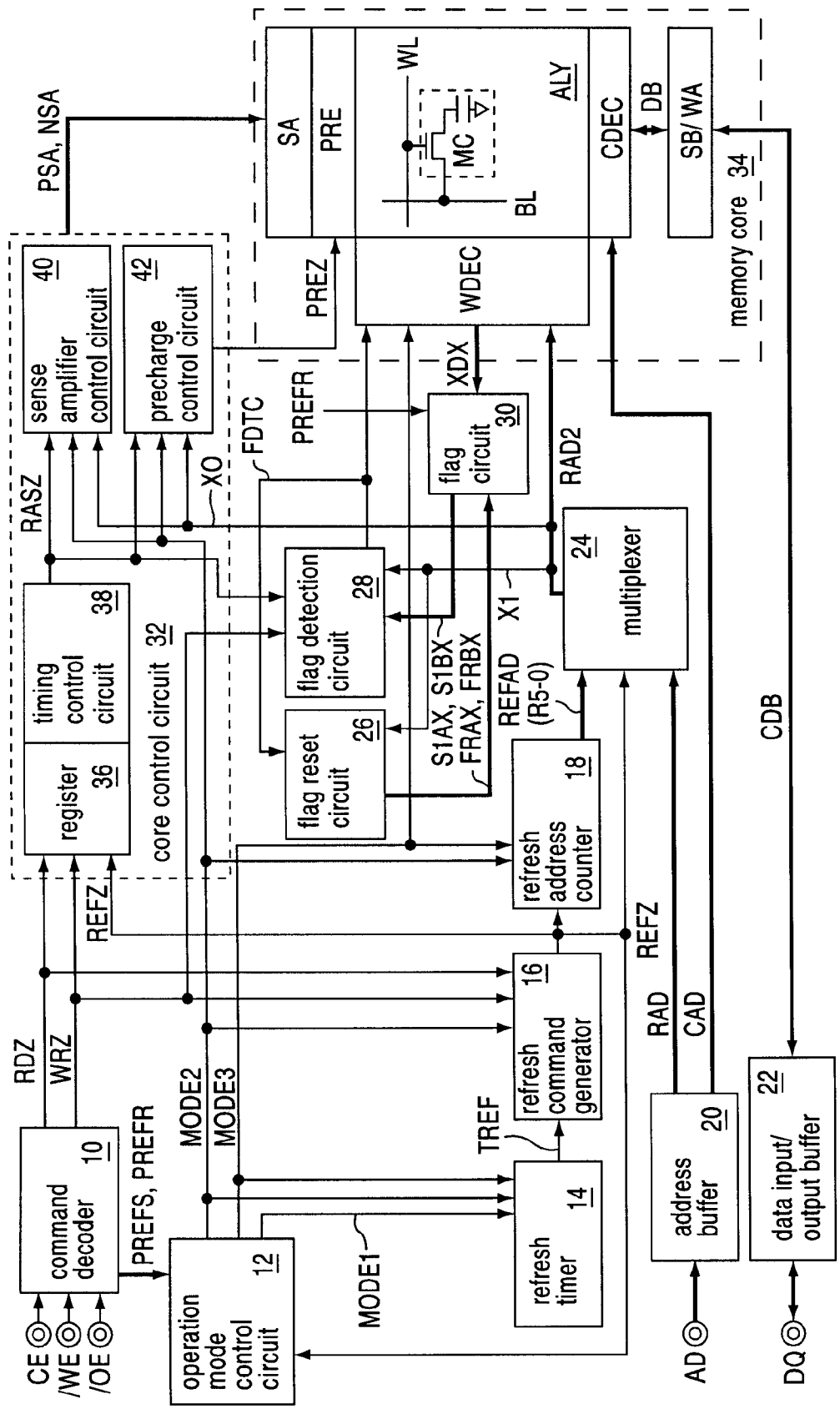
FIG. 1 is a block diagram showing a first embodiment of the semiconductor memory of the present invention.

Hereinafter, embodiments of the present invention will be described, using the drawings. In the drawings, each signal line shown by the heavy line signifies that it is constituted of a plurality of lines, and each block to which the heavy-line signal line is connected is constituted of a plurality of circuits. Each signal ending in "Z" represents positive logic, and each signal starting with "/" and each signal ending in "X" represent negative logic. The double circles in the drawings represent external terminals. Signal lines are designated by the same reference symbols as those designating the names of signals transmitted therethrough. In the following description, the names of signals are sometimes abbreviated, such as a "CLK signal" for a "clock signal CLK" and a "CE signal" for a "chip enable signal CE".

FIG. 1 shows a first embodiment of the semiconductor memory of the present invention. This semiconductor memory is formed as a pseudo SRAM having DRAM memory cells and SRAM interfaces by using a CMOS technology. The pseudo SRAM periodically executes a refresh operation inside a chip to retain data written to memory cells without receiving any external refresh command. This pseudo SRAM is used as, for example, a work memory mounted on a cellular phone.

The pseudo SRAM has a command decoder 10, an operation mode control circuit 12, a refresh timer 14, a refresh command generator 16, a refresh address counter 18, an address buffer 20, a data input/output buffer 22, a multiplexer 24, a flag reset circuit 26, a flag detection circuit 28, a flag circuit 30 (flag set circuit), a core control circuit 32, and a memory core 34. The operation mode control circuit 12 and the core control circuit 32 operate as control circuits executing operations in a first and a second memory mode, which will be described later.

The command decoder 10 receives command signals (a chip enable signal CE, a write enable signal /WE, and an output enable signal /OE) via external terminals to decode the received commands and output a read control signal RDZ or a write control signal WRZ. Further, the command decoder 10 outputs a partial mode start signal PREFS (pulse signal) in synchronization with a falling edge of the CE signal and outputs a partial mode release signal PREFR (pulse signal) in synchronization with a rising edge of the CE signal.

The operation mode control circuit 12 outputs mode signals MODE1, MODE2, MODE3 according to the partial mode start signal PREFS, the partial mode release signal PREFR, and a refresh control signal REFZ. The refresh timer 14 outputs a refresh request signal TREF having an oscillation cycle that is determined according to the mode signals MODE 1–3.

When receiving the refresh request signal TREF prior to the read control signal RDZ or the write control signal WRZ, the refresh command generator 16 outputs the refresh command signal REFZ in synchronization with the refresh request signal TREF. When receiving the refresh request signal TREF after the read control signal RDZ or the write control signal WRZ, the refresh command generator 16 outputs the refresh control signal REFZ following a read operation that is executed in response to the RDZ signal or a write operation that is executed in response to the WRZ signal. This means that the refresh command generator 16 operates as an arbiter determining the order of precedence of the read operation/the write operation, and the refresh operation.

The refresh address counter 18 updates a refresh address signal REFAD (R5-0) in synchronization with the refresh control signal REFZ. The specifications for updating the refresh address signal REFAD are changed according to the mode signals MODE2–3. The number of bits of the refresh address signal REFAD corresponds to the number of the word lines WL formed in the memory core 34 (64 lines in this example). Therefore, the number of bits of the refresh address signal REFAD is not limited to 6 bits but is set according to the number of the word lines WL formed in the memory core 34.

The address buffer 20 receives an address signal AD via an address terminal to output the received signal as a row address signal RAD (high-order address) and a column address signal CAD (low-order address). This means that this pseudo SRAM is an address non-multiplex type memory receiving the high-order address and the low-order address concurrently.

The data input/output buffer 22 receives read data via a common data bus CDB to output the received data to a data terminal DQ, and receives write data via the data terminal DQ to output the received data to the common data bus CDB. The number of bits of the data terminal DQ is, for example, 16 bits.

The multiplexer 24 outputs the refresh address signal REFAD as a row address signal RAD2 when the refresh control signal REFZ is at high level while outputting the row address signal RAD as the row address signal RAD2 when the refresh control signal REFZ is at low level.

The flag reset circuit 26, when receiving a flag detection signal FDTC, outputs a flag reset signal FRAX or FRBX according to the lowest-order bit X0 of the row address signal RAD2. The flag detection circuit 28 outputs values that it holds for the pair of flags, as flag output signals S1AZ, S1BX, respectively, in synchronization with a decode signal XDX. The flag detection circuit 28 sets the flags in synchronization with pulses of the partial mode release signal PREFR while resetting the flags in synchronization with pulses of the flag reset signals FRAX, FRBX. The flag circuits 30 outputs the flag detection signal FDTC when receiving the flag output signals S1AX, S1BX.

The core control circuit 32 has a register 36, a timing control circuit 38, a sense amplifier control circuit 40, and a precharge control circuit 42. The register 36 temporarily retains the read control signal RDZ or the write control signal WRZ when the refresh command generator 16 outputs the refresh control signal REFZ in precedence over the read control signal RDZ or the write control signal WRZ. The timing control circuit 38 outputs a row activation signal RASZ when receiving one of the RDZ signal, the WRZ signal, and the REFZ signal. The sense amplifier control circuit 40 outputs sense amplifier activation signals PSA, NSA for activating a sense amplifier SA in synchronization with the RASZ signal. The precharge control circuit 42 outputs a precharge signal PREZ in synchronization with the RASZ signal when the memory core 34 is not in operation. Operation timings of the sense amplifier control circuit 40 and the precharge control circuit 42 are changed according to the mode signal MODE2 and a value of the lowest-order bit X0 of the refresh address signal REFAD.

The memory core 34 has the sense amplifier SA, a precharge circuit PRE, a memory cell array ALY, a word decoder WDEC, a column decoder CDEC, a sense buffer SB, and a write amplifier WA. The sense amplifier SA operates according to the sense amplifier activation signals PSA, NSA. The precharge circuit PRE operates according to the precharge signal PREZ. The memory cell array ALY has a plurality of volatile memory cells MC (dynamic memory cells; hereinafter, also referred to as C00, C10, and so forth), and a plurality of word lines WL and a plurality of bit lines BL connected to the memory cells MC. Each of the memory cells MC, which are the same as memory cells of a typical DRAM, has a capacitor for retaining data as electric charges and a transfer transistor disposed between this capacitor and the bit line BL. A gate of the transfer transistor is connected to the word line WL.

The word decoder WDEC selects one or two of the word lines WL according to the row address signal RAD2, the mode signal MODE3, and the flag detection signal FDTC to raise voltage of the selected word line(s) WL to predetermined high voltage. In synchronization with the selection of the word line(s) WL, the word decoder WDEC outputs the decode signal XDX corresponding to each selected word line WL.

According to the column address signal CAD, the column decoder CDEC outputs a column line signal (later described CLZ in FIG. 9) for turning on one of column switches (later described SCW in FIG. 9) that connect the bit lines BL and a data bus DB, respectively. The sense buffer SB amplifies a signal volume of read data on the data bus DB to output it to the common data bus CDB. The write amplifier WA amplifies a signal volume of write data on the common data bus CDB to output it to the data bus DB.

Figure 2:
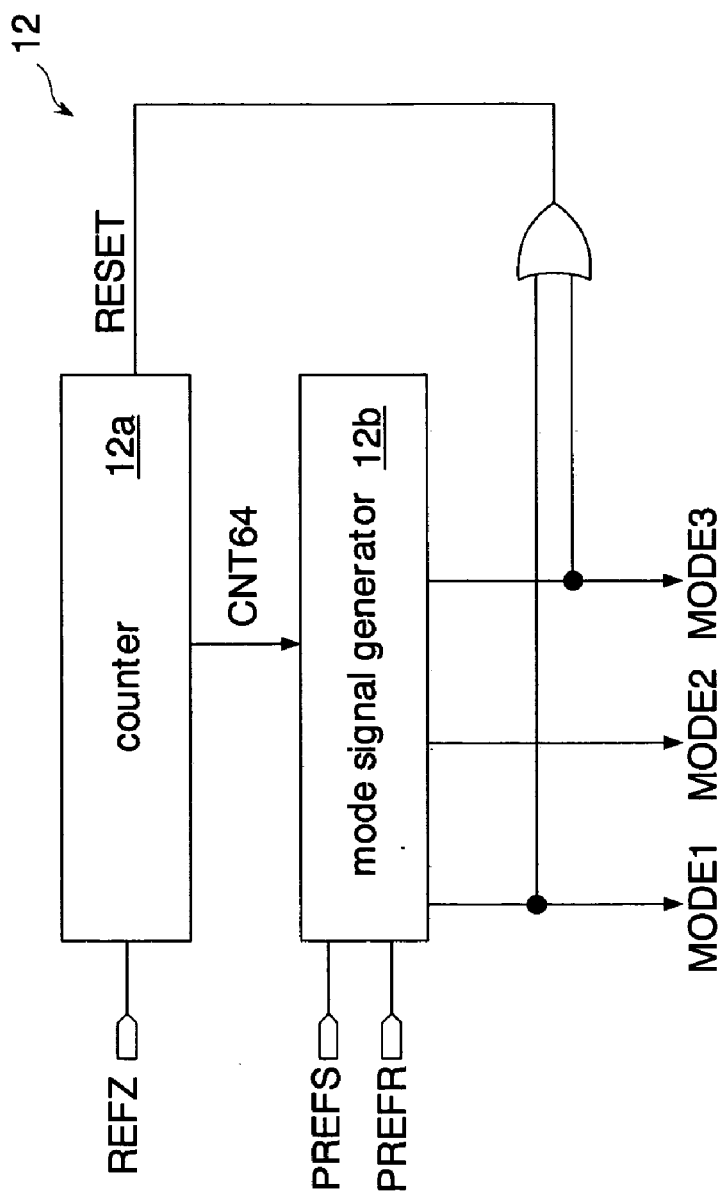
FIG. 2 is a block diagram showing details of an operation mode control circuit shown in FIG. 1.

FIG. 2 shows details of the operation mode control circuit 12 shown in FIG. 1.

The operation mode control circuit 12 has a counter 12a and a mode signal generator 12b. The counter 12a performs a counting operation in synchronization with rising edges of the refresh control signal REFZ to output a counter signal CNT64 at the 64th counting operation. The counter 12a is reset in response to a reset signal RESET. The reset signal RESET is outputted when the mode signal MODE1 or the mode signal MODE3 is at high level.

Incidentally, the number of times "64" of counting corresponds to the number of the word lines WL formed in the memory core 34. In this embodiment, for easier understanding of the description, the number of the word lines WL is assumed to be 64, but the number of the word lines WL actually formed is, for example, 2048. In this case, the counter 48*a* outputs the counter signal at 2048th counting operation.

The mode signal generator 12*b* outputs the mode signals MODE1–3 according to the partial mode start signal PREFS, the partial mode release signal PREFR, and the counter signal CNT64.

Figure 3:
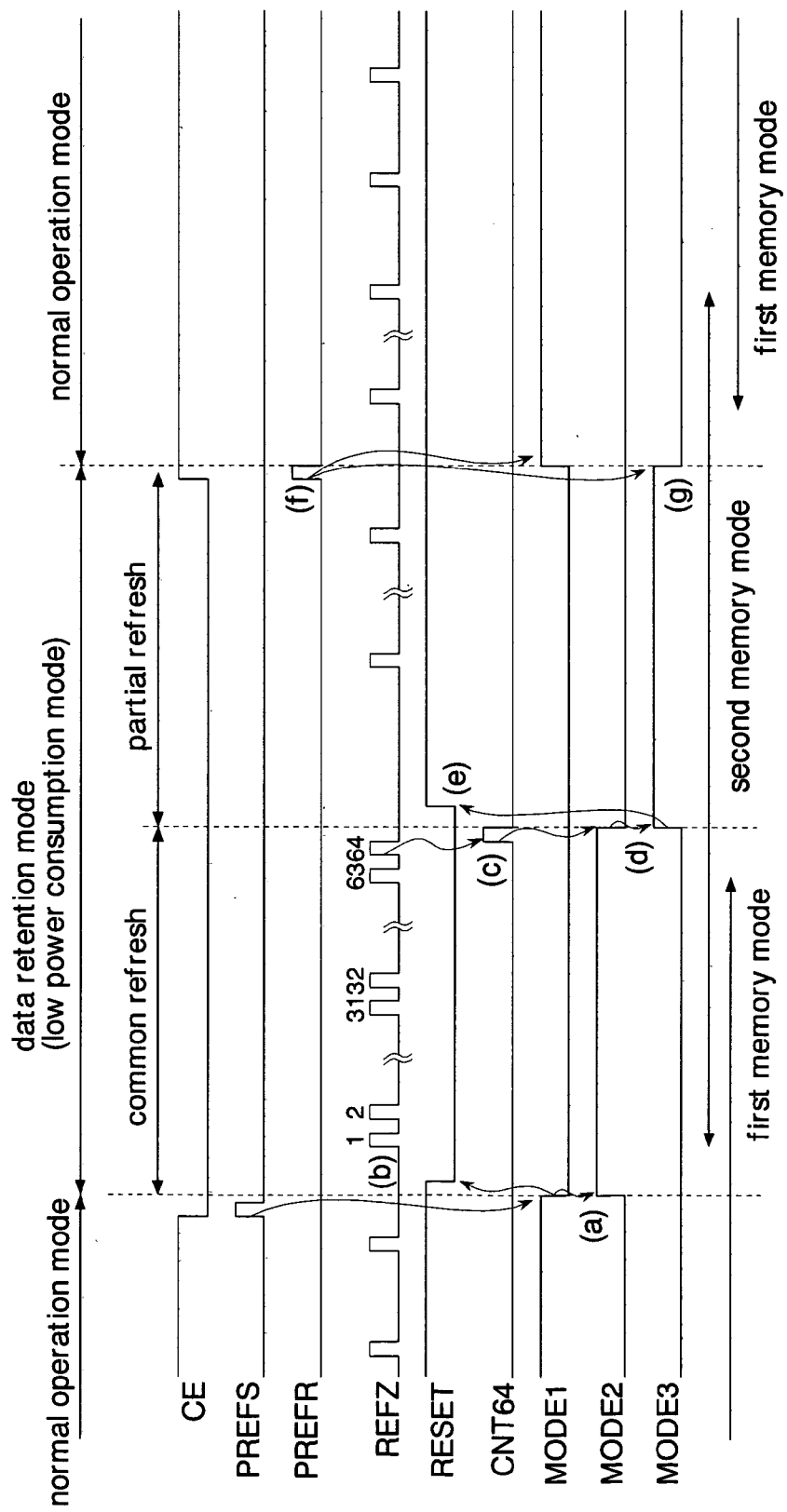
FIG. 3 is a timing chart showing an operation of the operation mode control circuit shows in FIG. 2.

FIG. 3 shows operations of the operation mode control circuit 12 shown in FIG. 2.

The pseudo SRAM of this embodiment is in a normal operation mode while the CE signal is at high level and in a data retention mode (low power consumption mode) while the CE signal is at low level. At the start of the data retention mode, a common refresh operation is executed (common refresh mode), and a partial refresh operation is executed after the common refresh operation (partial refresh mode).

A refresh operation during the normal operation mode is executed for one memory cell MC of each bit line BL in compliance with the operation of the sense amplifier SA (single cell operation). A refresh operation during the data retention mode is executed for two memory cells MC of each bit line BL (twin cell operation) in compliance with the operation of the sense amplifier SA. In other words, one word line WL is selected in one refresh operation in the normal operation mode, and two word lines WL are selected in one refresh operation in the data retention mode. The data retention mode is the combination of so-called partial refresh technology and twin cell technology. Consequently, power consumption during the data retention mode is greatly reduced compared with that in a prior art.

The pseudo SRAM recognizes the normal operation mode when the mode signal MODE1 is at high level, recognizes the common refresh mode (data retention mode) when the mode signal MODE2 is at high level, and recognizes the partial refresh mode (data retention mode) when the mode signal MODE3 is at high level.

In the normal operation mode prior to the data retention mode, data in the memory cells are retained in the first memory mode except for a special case. The special case is a case where the operation mode shifts to the data retention mode immediately after the return to the normal operation mode from the data retention mode as shown in later-described FIG. 23.

In the common refresh mode, data in the memory cells are retained in the first memory mode or the second memory mode. More specifically, in the common refresh mode, the states of the memory cells sequentially shift from the first memory mode to the second memory mode every time a refresh request is generated.

In the partial refresh mode, data in the memory cells are retained in the second memory mode. In the normal operation mode following the partial refresh mode, data in the memory cells are retained in the second memory mode or in the first memory mode. Specifically, in the normal operation mode following the partial refresh mode, the states of the memory cells sequentially shift from the second memory mode to the first memory mode at every access (external access command or refresh command).

When receiving the partial mode start signal PREFS during the normal operation mode, the operation mode control circuit 12 changes the mode signals MODE1, MODE2 to low level and high level, respectively, to shift the operation mode from the normal operation mode to the common refresh mode (FIG. 3(*a*)). The reset signal RSET is deactivated in synchronization with low level of the mode signal MODE1.

The counter 12*a* is released from the reset state in response to low level of the reset signal RESET to start the counting operation in synchronization with the refresh control signal REFZ (FIG. 3(*b*)). The refresh operation is executed in response to the refresh control signal REFZ. In the common refresh mode, since it is necessary to select all the word lines WL of the memory core 34, the refresh control signal REFZ is outputted 64 times. Operations of the refresh timer 14 and the refresh command generator 18 for generating the refresh command signal REFZ will be described in later-described FIG. 35.

In synchronization with the 64th counting operation, the counter 12*a* outputs the counter signal CNT64 (FIG. 3(*c*)). In synchronization with the counter signal CNT64, the operation mode control circuit 12 changes the mode signal MODE2 and the mode signal MODE3 to low level and high level, respectively (FIG. 3(*d*)). Then, the operation mode shifts from the common refresh mode to the partial refresh mode. The reset signal RESET is activated in synchronization with the change of the mode signal MODE3 to high level (FIG. 3(*e*)). The counter 12*a* is reset when receiving high level of the reset signal RESET. In a period during which the mode signal MODE3 is at high level, the partial refresh operation is executed in sequence.

The partial mode release signal PREFR is outputted in response to the change to high level of the CE signal supplied via the external terminal (FIG. 3(*f*)). When receiving the partial mode release signal PREFR during the partial refresh mode, the operation mode control circuit 12 changes the mode signals MODE3, MODE1 to low level and high level, respectively, and accordingly shifts the operation mode to the normal operation mode (FIG. 3(*g*)).

Figure 4:
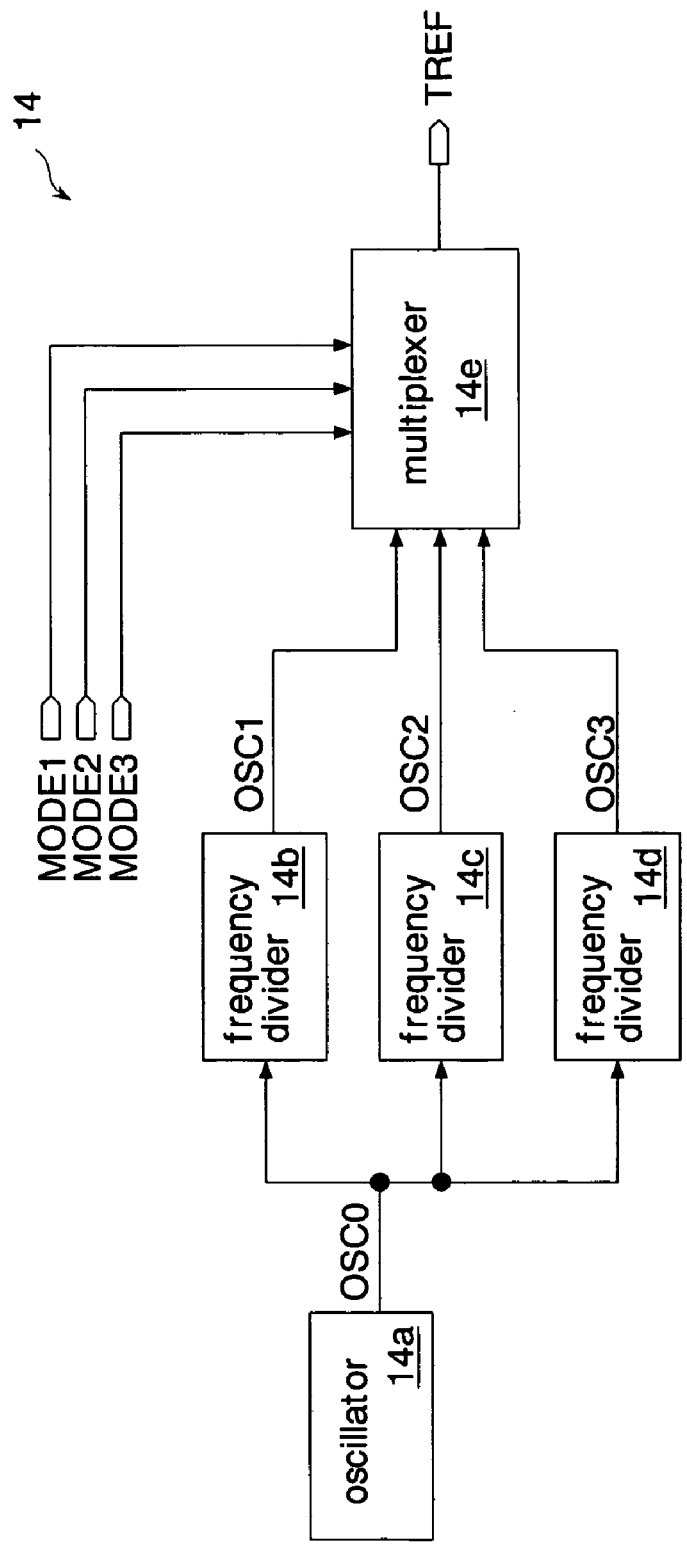
FIG. 4 is a block diagram showing details of a refresh timer shown in FIG. 1.

FIG. 4 shows details of the refresh timer 14 shown in FIG. 1.

The refresh timer 14 has an oscillator 14*a* generating an oscillation signal OSC0, frequency dividers 14*b*, 14*c*, 14*d* dividing a frequency of the OSC0 signal to generate oscillation signals OSC1, OSC2, OSC3, respectively, and a multiplexer 14*e* selecting one of the oscillation signals OSC1, OSC2, OSC3 according to the mode signals MODE1–3 to output it as the refresh request signal TREF. The frequency dividers 14*b*, 14*c*, 14*d* convert the frequency of the OSC0 signal to one eighth, one sixteenth, and one thirty-seconds, respectively.

Figure 5:
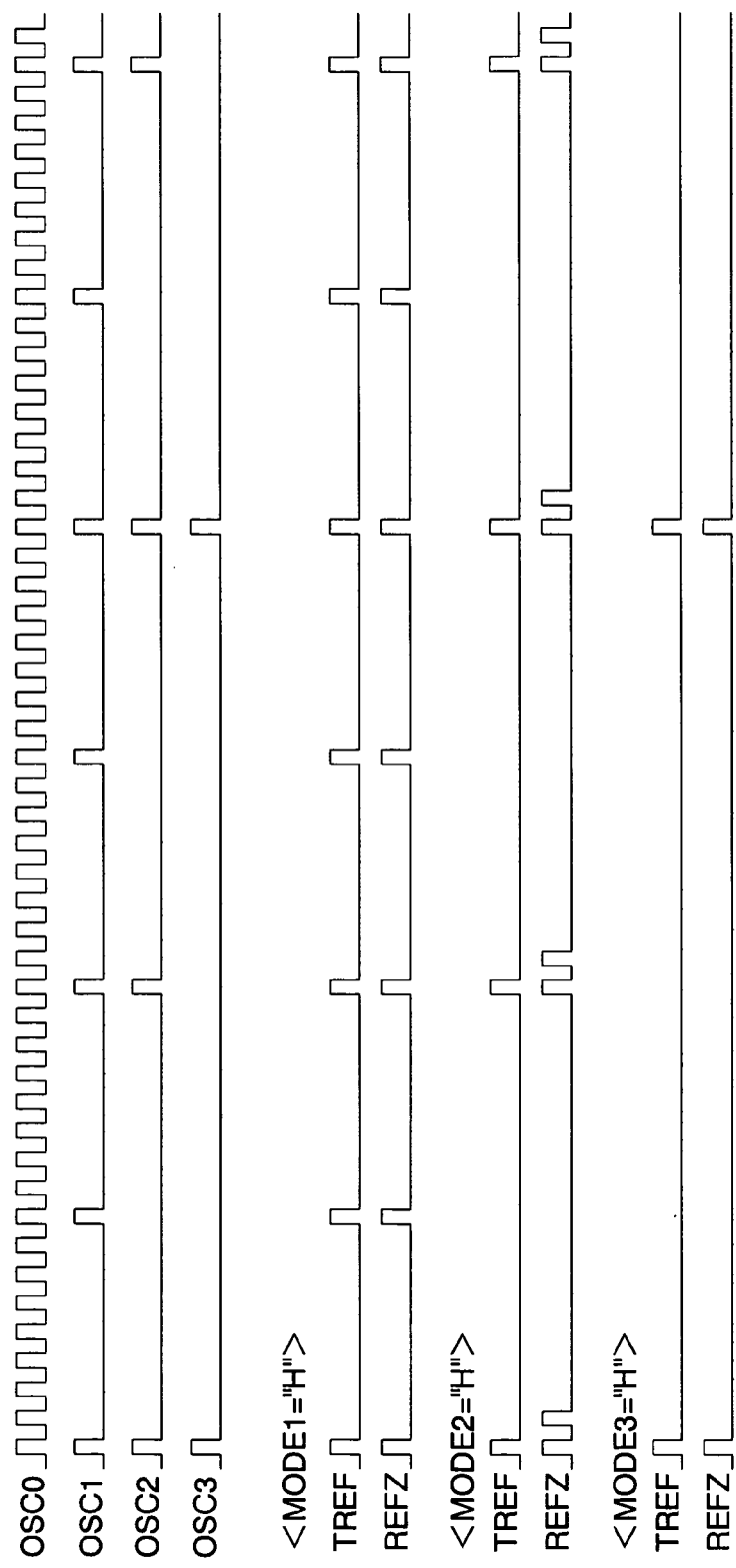
FIG. 5 is a timing chart showing operations of the refresh timer and a refresh command generator in the first embodiment.

FIG. 5 shows operations of the refresh timer 14 and the refresh command generator 16.

When the mode signal MODE1, MODE2, or MODE3 is at high level, the refresh timer 14 outputs, as the refresh request signal TREF, the oscillation signal OSC1, OSC2, or OSC3, respectively. The refresh command generator 16 outputs the refresh request signal TREF as the refresh control signal REFZ when the mode signal MODE1 or MODE3 is at high level. The refresh command generator 16 outputs the refresh control signal REFZ twice in synchronization with the refresh request signal TREF when the mode signal MODE2 is at high level.

Figure 6:
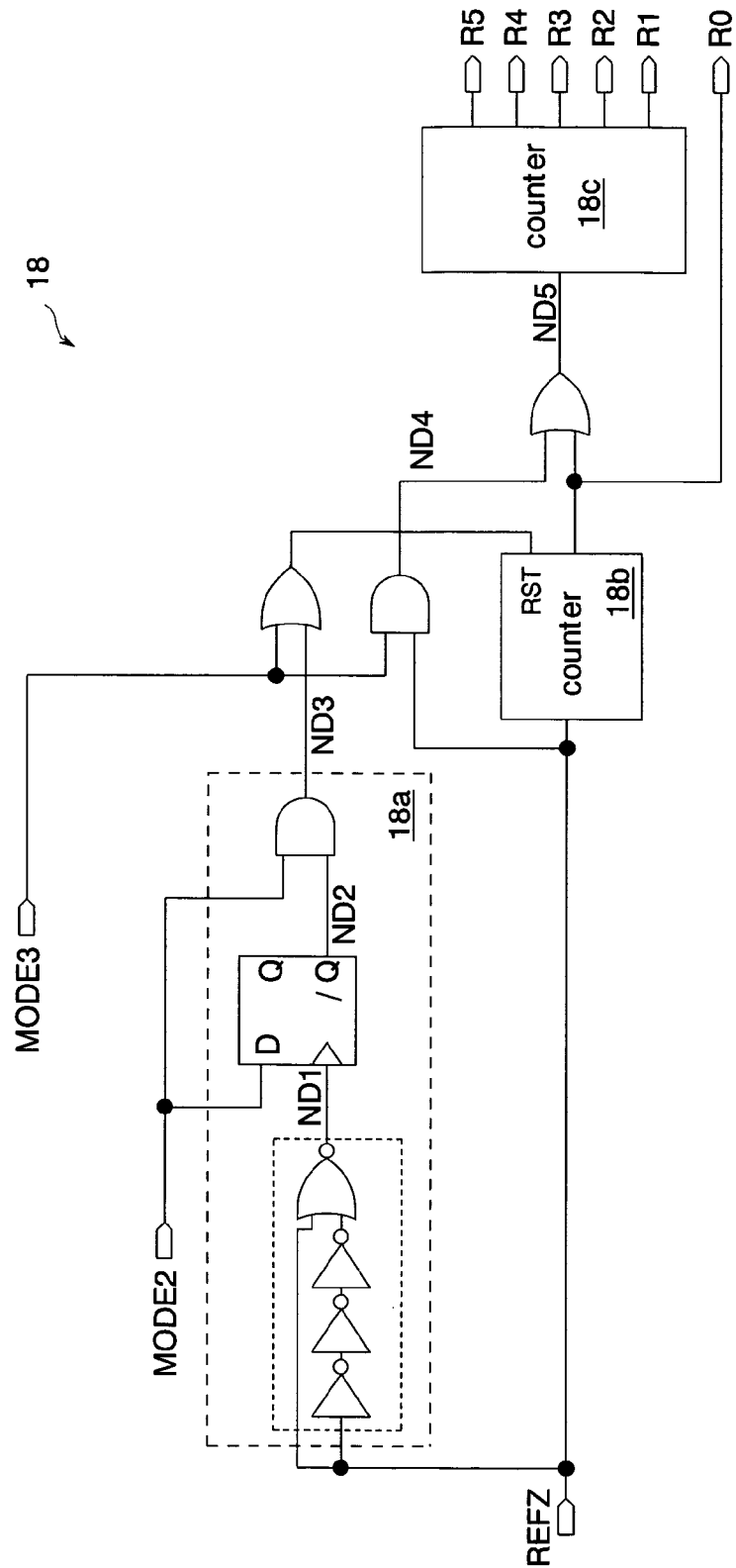
FIG. 6 is a block diagram showing details of a refresh address counter shown in FIG. 1.

FIG. 6 shows details of the refresh address counter 18 shown in FIG. 1.

The refresh address counter 18 has a reset circuit 18*a*, counters 18*b*, 18*c*, and a logic gate controlling the counters 18*b*, 18*c*. The reset circuit 18*a* has a pulse generator generating a positive pulse in synchronization with a falling edge of the refresh control signal REFZ, a D flipflop latching the mode signal MODE2 in synchronization with an output signal of the pulse generator, and an AND gate detecting rising edges of the mode signal MODE2.

The counter 18b performs a counting operation in synchronization with the refresh control signal REFZ to generate the lowest-order bit R0 of the refresh address signal REFAD. The counter 18b is reset when the mode signal MODE3 is at high level and in synchronization with the rising edges of the mode signal MODE2.

When the mode signal MODE3 is at high level, the counter 18c performs a counting operation in synchronization with the refresh control signal REFZ to update bits R5-1 of the refresh address signal REFAD. When the mode signal MODE1 or MODE2 is at high level (excluding a predetermined period following a rising edge of the mode signal MODE2), the counter 18c performs a counting operation in synchronization with the address signal R0 outputted from the counter 18b to update the bits R5-1.

Figure 7:
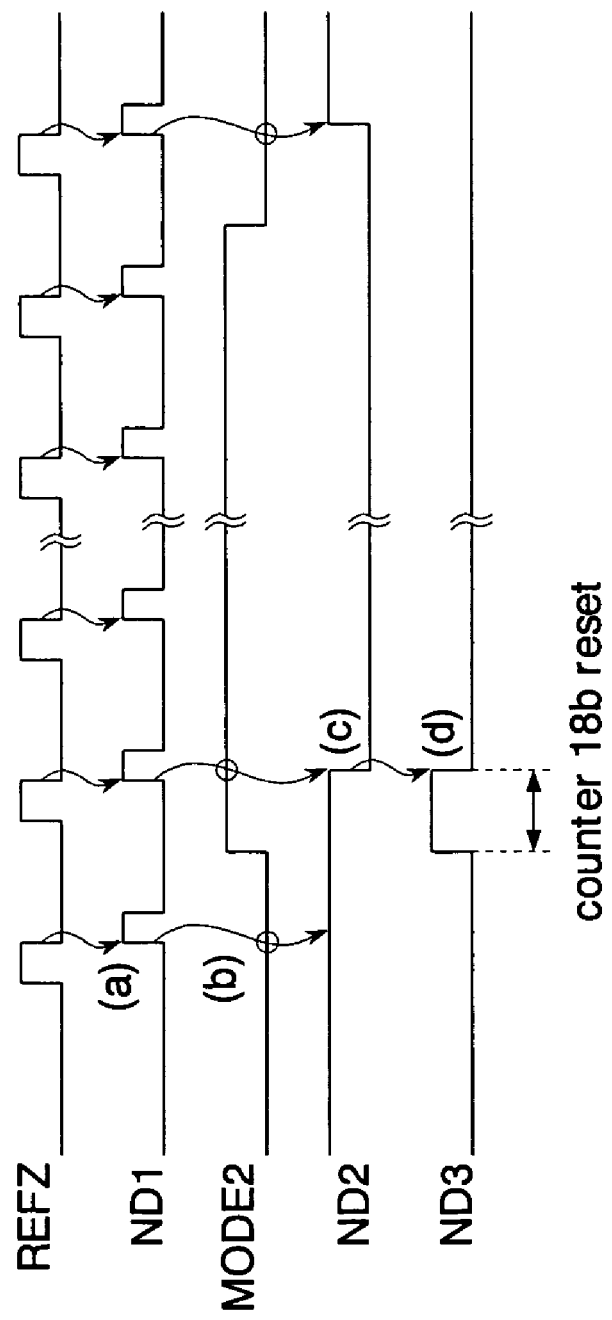
FIG. 7 is a timing chart showing an operation of a reset circuit of the refresh address counter shown in FIG. 6.

FIG. 7 shows operations of the reset circuit 18a shown in FIG. 6.

The pulse generator outputs a pulse signal to a node ND1 in synchronization with a falling edge of the refresh control signal REFZ (FIG. 7(a)). The D flipflop latches the mode signal MODE2 in synchronization with the pulse signal at the node ND1 to output an inverse logic of the mode signal MODE2 to a node ND2 (FIG. 7(b)). Accordingly, after the mode signal MODE2 changes to high level, the node ND2 is changed to low level in synchronization with the first refresh control signal REFZ (FIG. 7(c)). Then, an AND logic of the logic levels of the mode signal MODE2 and the node ND2 is outputted to a node ND3 (FIG. 7(d)). The counter 18b shown in FIG. 6 is reset during a high-level period of the node ND3, that is, during a period of the first refresh operation after the mode signal MODE2 changes to high level.

FIG. 8 shows operations of the refresh address counter 18 shown in FIG. 6.

When the mode signal MODE1 or MODE2 is at high level, that is, during the normal operation mode and the common refresh mode, the refresh address counter 18 sequentially counts up the 6 bits R5-0 of the refresh address in synchronization with the refresh control signal REFZ. Further, when the mode signal MODE3 is at high level, that is, during the partial refresh mode, the refresh address counter 18 sequentially counts up the 5 bits R5-1 of the refresh address signals in synchronization with the refresh control signal REFZ. At this time, the refresh address signal R0 is fixed to low level.

Figure 9:
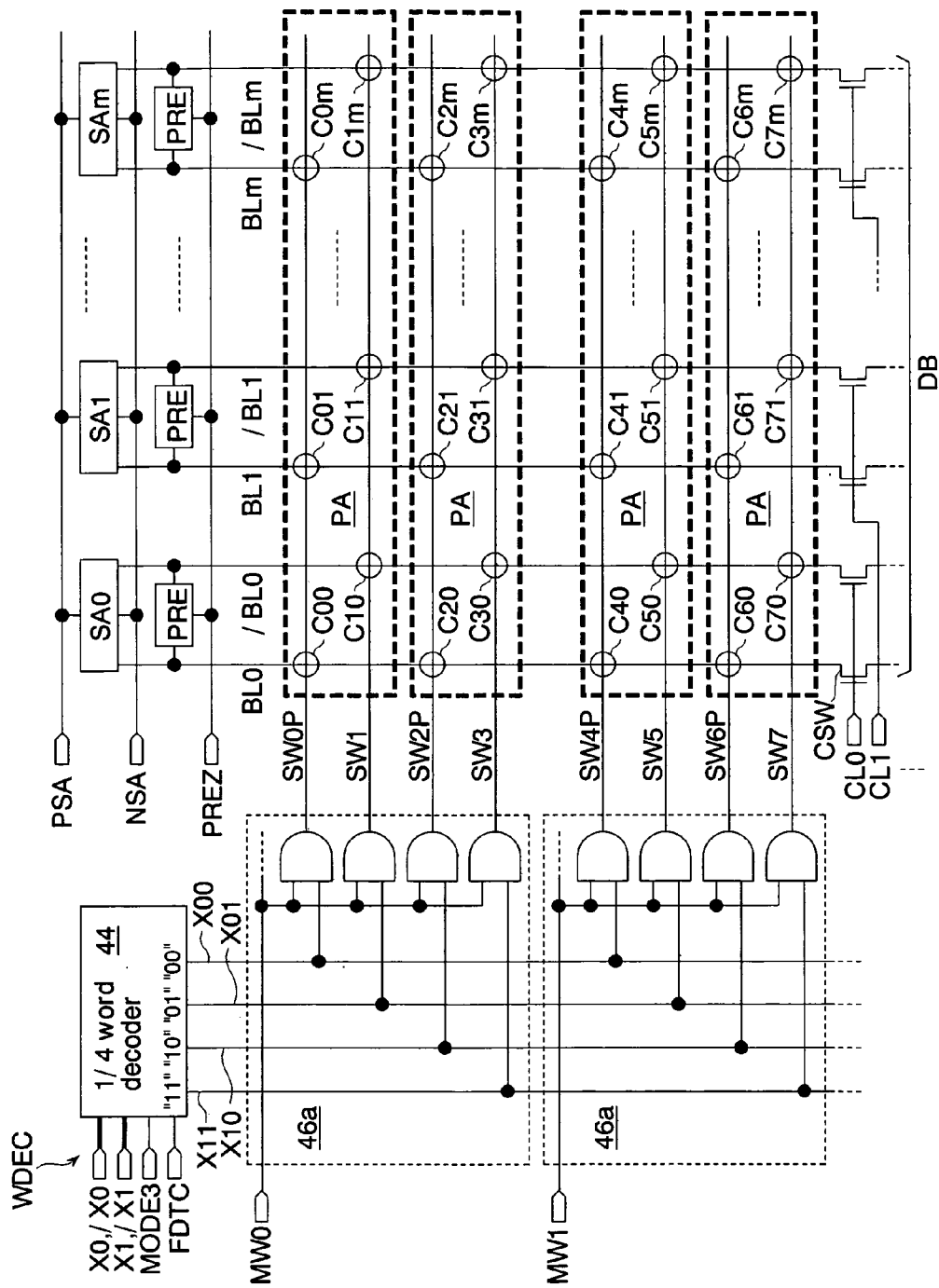
FIG. 9 is a block diagram showing details of an essential part of a memory core shown in FIG. 1.

FIG. 9 shows details of an essential part of the memory core 34 shown in FIG. 1.

The word decoder WDEC of the memory core 34 has a ¼ word decoder 44 and a plurality of sub word decoders 46a corresponding to main word lines MW (MW0, MW1, ...), respectively.

When the mode signal MODE3 and the flag detection signal FDTC are at low level, the ¼ word decoder 44 outputs one of decode signals X11, X10, X01, X00 according to the two low-order bits X1, X0 of the row address signal RAD2 and inverse bits /X1, /X0 thereof. When one of the mode signal MODE3 and the flag detection signal FDTC is at high level, the ¼ word decoder 44 outputs the two decode signals X11, X10 or X01, X00 according to the one low-order bit X1 of the row address signal RAD2 and the inverse bit /X1 thereof. The ¼ word decoder 44 operates as a control circuit executing operations of the first and second memory modes which will be described later.

Each of the sub word decoders 46a is activated when the main word line MW (MW0, MW1, ...) is at high level to make a selection from the sub word lines SW (SW0P, SW1, SW2P, SW3, ...) according to the decode signals X11, X10, X01, X00. The main word line MW is selected according to the high-order bits of the row address signal RAD2 by a not-shown predecoder. Then, the memory cell MC connected to the selected sub word line SW is accessed. Thus, in this embodiment, each of the word lines WL shown in FIG. 1 is constituted of the main word line and the sub word lines SW.

The memory cells connected to the adjacent two sub word lines (for example, SW0P, SW1) constitute each partial area PA (memory cell group; each frame in the heavy broken line). In the partial area PA, the memory cells connected to the bit lines BL (BL0, BL1, ...), /BL (/BL0, /BL1, ...) are connected to the sub word lines SW different from one another.

The sub word lines SW ending in "P" represent partial word lines. Data written in the memory cells connected to the partial word lines SWP (for example, partial memory cells C00, C01, ..., C0m) are retained during the data retention mode. The sub word lines SW not ending in "P" represent common word lines. Data in the memory cells MC connected to the common word lines SW (for example, common memory cells C10, C11, ... C1m) are not retained during the data retention mode.

The partial word lines SWP and the regular sub word lines SW are alternately arranged. That is, the word lines SWP, SW are arranged adjacent to each other. As will be described later, the word lines SWP, SW are selected concurrently during the data retention mode, so that the two memory cells are accessed concurrently (twin cell operation). Therefore, the arrangement of these word lines SWP, SW adjacent to each other prevents the complication of wiring layout in the word decoder WDEC. In particular, this arrangement facilitates designing the wiring layout of the sub word decoders 46a.

In this embodiment, a half of the memory cells MC formed in the memory core 34 are the partial memory cells. Therefore, data corresponding to a half of the memory capacity of the pseudo SRAM are retained during the data retention mode.

The complementary bit lines BL (BL0, BL1, ...), /BL (/BL0, /BL1, ...) are connected to the same sense amplifier SA and precharge circuit PRE. Further, the bit lines BL, /BL are connected to the data bus line DB via the column switches CSW. The column switches CSW are turned on by a column selection signal CL (CL0, CL1, ...) that is the decoded column address signal CAD. The sense amplifier SA and the precharge circuit PRE will be detailed in later-described FIG. 11.

Figure 10:
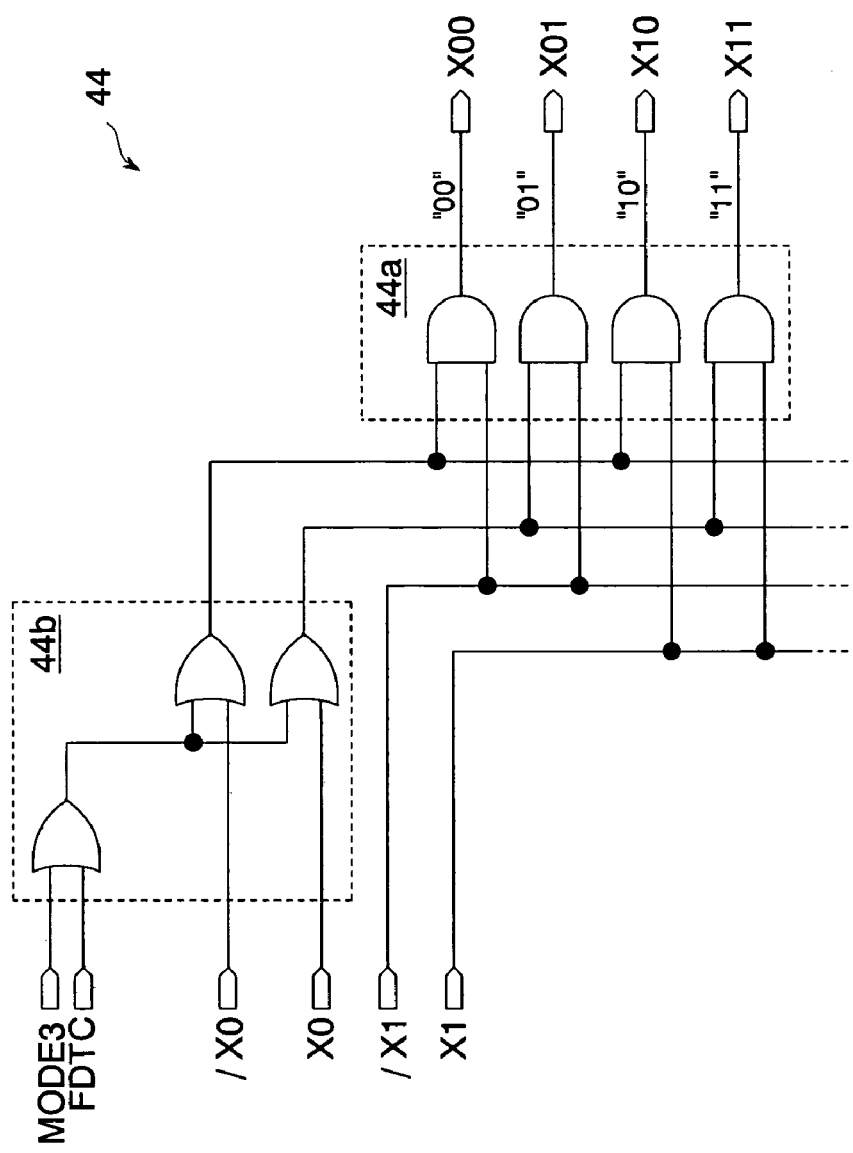
FIG. 10 is a circuit diagram showing details of a ¼ word decoder shown in FIG. 9.

FIG. 10 shows details of the ¼ word decoder 44 shown in FIG. 9.

The ¼ word decoder 44 has a decoder 44a decoding the row address signals X0, /X0, X1, /X1 in order to generate the decode signals X11, X10, X01, X00 and a mask circuit 44b that masks the row address signals X0, /X0 to output high level to the decoder 44a when the mode signal MODE3 or the flag detection signal FDTC is at high level.

Figure 11:
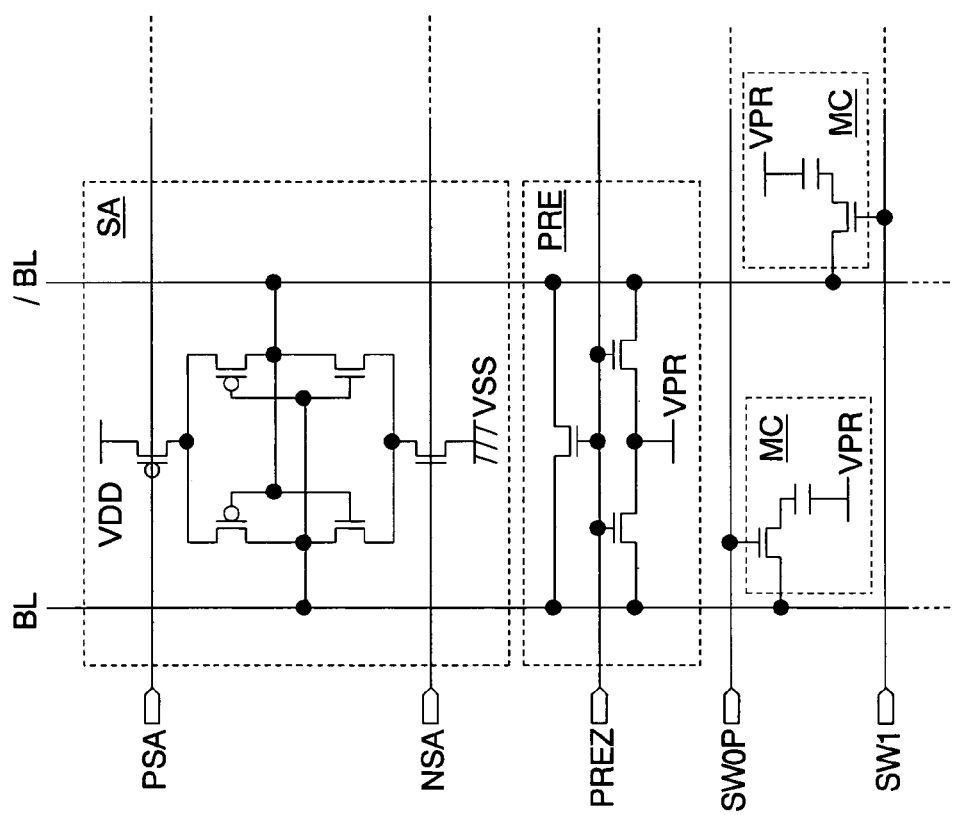
FIG. 11 is a circuit diagram showing details of a sense amplifier and a precharge circuit shown in FIG. 9.

FIG. 11 shows details of the sense amplifier SA and the precharge circuit PRE shown in FIG. 9.

The sense amplifier SA has: two CMOS inverters whose inputs and outputs are connected to each other; a PMOS transistor (pMOS switch) connecting sources of pMOS transistors of the CMOS inverters to a power supply line VDD; and an nMOS transistor (nMOS switch) connecting sources of nMOS transistors of the CMOS inverters to a ground line SS. The inputs (or outputs) of the CMOS inverters are connected to the bit lines BL, /BL, respectively. The pMOS switch turns on when the sense amplifier activation signal PSA is at low level, and the nMOS switch turns on when the sense amplifier activation signal NSA is at high level. Turning on of the pMOS switch and the nMOS switch causes the CMOS inverters to activate, and a voltage difference between the bit lines BL, /BL is differentially amplified.

The precharge circuit PRE has an nMOS transistor connecting the bit lines BL, /BL to each other and nMOS transistors respectively connecting the bit lines BL, /BL to a precharge voltage line VPR. The nMOS transistors turn on when the precharge signal PREZ is at high level to connect the bit lines BL, /BL to the precharge voltage line VPR.

Figure 12:
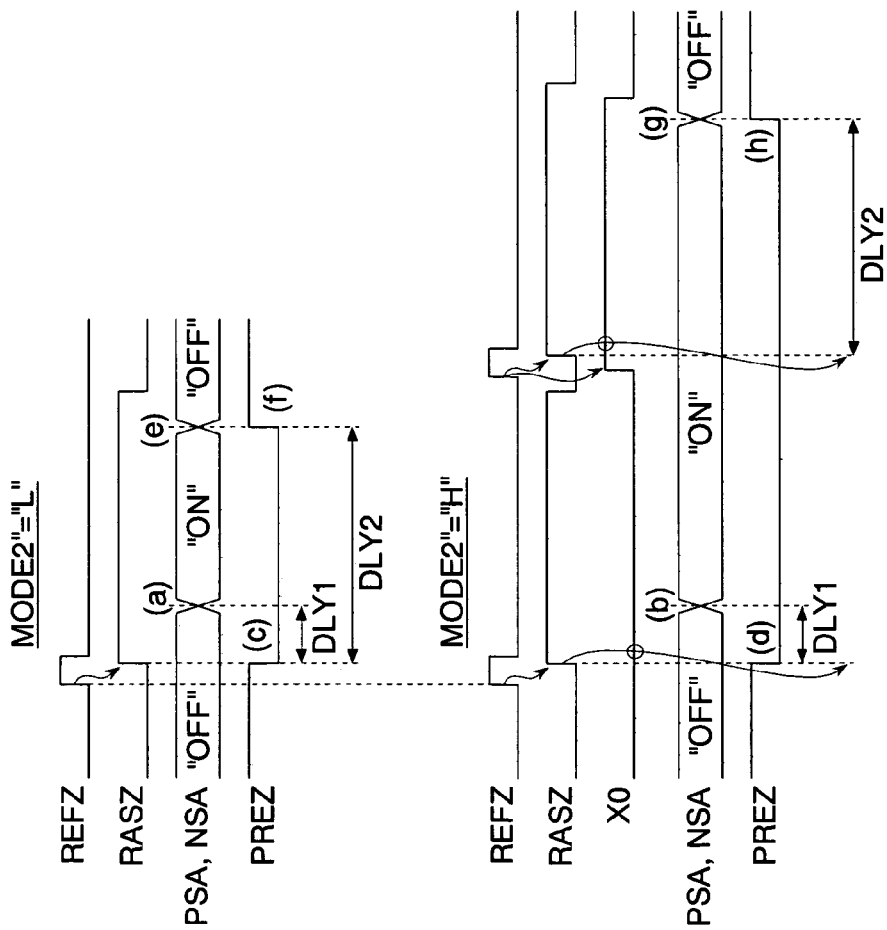
FIG. 12 is a timing chart showing operations of a sense amplifier control circuit and a precharge control circuit shown in FIG. 1.

FIG. 12 shows operations of the sense amplifier control circuit 40 and the precharge control circuit 42.

After a delay time DLY1 from a rising edge of the RASZ signal, the sense amplifier control circuit 40 changes the sense amplifier activation signals PSA, NSA to activate the sense amplifier SA irrespective of the logic level of the mode signal MODE2 (FIG. 12 (a, b)). "ON" and "OFF" in the drawing represent the activation and the deactivation of the sense amplifier SA, respectively. In synchronization with a rising edge of the RASZ signal, the precharge control circuit 42 changes the precharge signal PREZ to low level to stop a precharge operation irrespective of the logic level of the mode signal MODE2 (FIG. 12 (c, d)).

When the mode signal MODE2 is at low level, the sense amplifier control circuit 40 changes the sense amplifier activation signals PSA, NSA to deactivate the sense amplifier SA after a delay time DLY2 from a rising edge of the RASZ signal (FIG. 12(e)). When the mode signal MODE2 is at low level, the precharge control circuit 42 changes the precharge signal PREZ to high level to start the precharge operation after the delay time DLY2 from the rising edge of the RASZ signal (FIG. 12(f)).

When the mode signal MODE2 is at high level, the sense amplifier control circuit 40 changes the sense amplifier activation signals PSA, NSA to deactivate the sense amplifier SA after the delay time DLY2 from the rising edge of the RASZ signal after the row address signal X0 changes to high level (FIG. 12(g)). When the mode signal MODE2 is at high level, the precharge control circuit 42 changes the precharge signal PREZ to start the precharge operation after the delay time DLY2 from the rising edge of the RASZ signal after the row address signal X0 changes to high level (FIG. 12(h)).

In short, during the common refresh mode, in order to write data retained in the partial memory cell C00 to the partial memory cell and the adjacent common memory cell C10, the sense amplifier SA is activated while the RASZ signal is outputted twice, and the precharge of the bit lines BL, /BL is prohibited. More specifically, data latched in the sense amplifier SA in synchronization with the refresh control signal REFZ that is outputted when the row address signal X0 is an even number is retained until the operation corresponding to the refresh control signal REFZ outputted after the row address signal X0 changes to an odd number.

Figure 13:
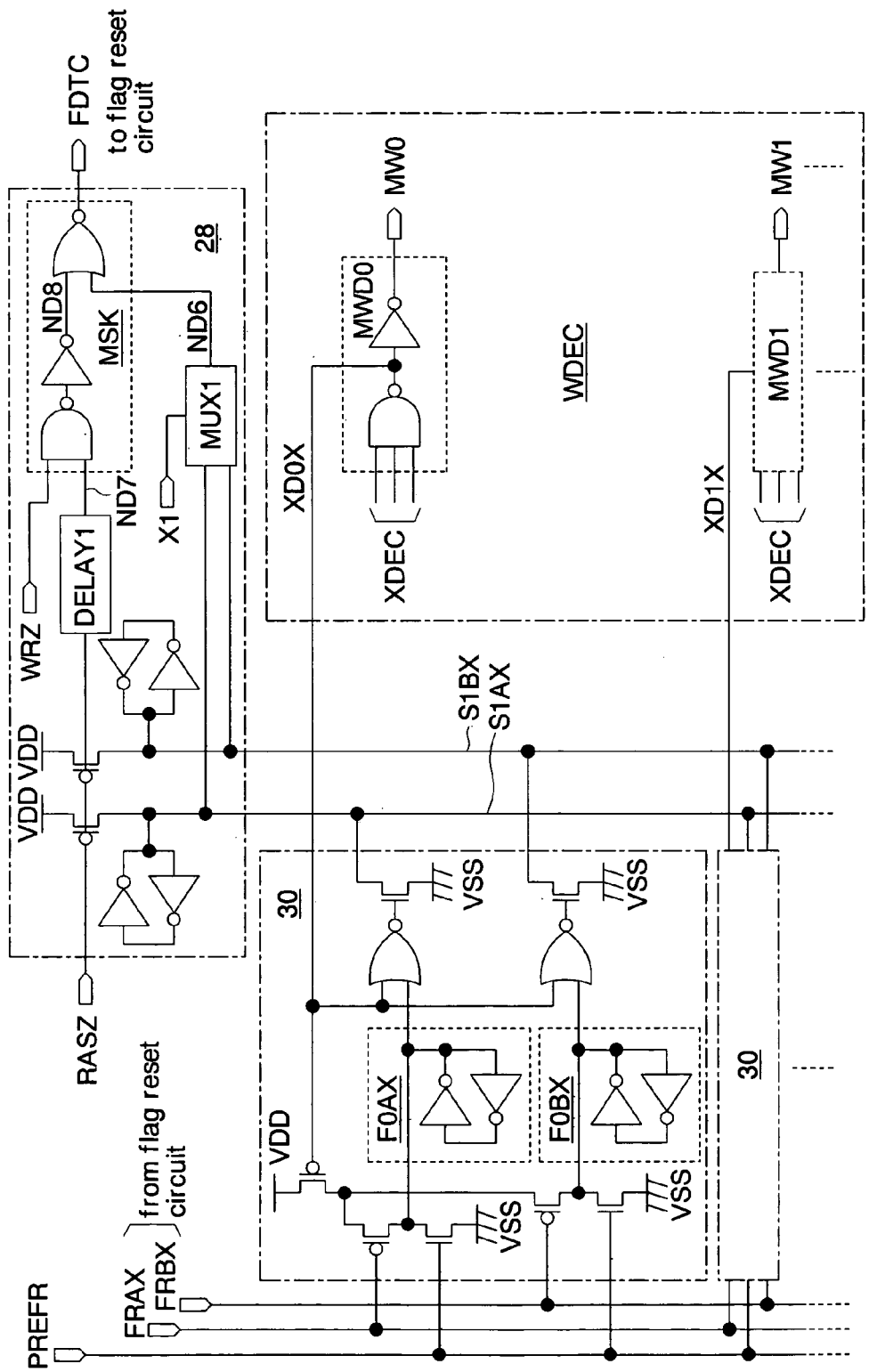
FIG. 13 is a circuit diagram showing details of a flag circuit and a flag detection circuit and an essential part of a word decoder, which are shown in FIG. 1.

FIG. 13 shows details of the flag circuit 30 and the flag detection circuit 28, and an essential part of the word decoder WDEC, which are shown in FIG. 1.

The flag circuit 30 has flags FAX (F0AX, F1AX, . . . ), FBX (F0BX, F1BX, . . . ) provided for each of the main word lines MW (MW0, MW1, . . . ). In other words, the flags FAX, FBX are formed for each of the partial areas PA.

Each of the flags FAX, FBX is constituted of a latch circuit composed of two inverters whose inputs and outputs are connected to each other. At the shift from the data retention mode to the normal operation mode, the flags FAX, FBX are set to low level when the memory cells in the corresponding partial area PA independently retain data (first memory mode, single cell operation), and are reset to high level when the memory cells in the corresponding partial area PA retain common data (second memory mode, twin cell operation).

More specifically, the flags FAX, FBX are set to low level in synchronization with the pulse of the partial mode release signal PREFR. This means that the all the flags FAX, FBX are set at the return from the data retention mode to the normal operation mode, as will be described later. In other words, all the flags FAX, FBX are set before the changing operation of changing the states of all the memory cells from the second memory mode to the first memory mode. The set flags FAX, FBX indicate that the single cell operation of the memory cells in the corresponding partial area PA is prohibited. Accordingly, only the twin cell operation is allowed in the partial area PA corresponding to the set flags FAX, FBX. Thus, the flag circuit 30 operates as a flag set circuit.

The flags FAX, FBX are reset to high level in synchronization with the flag reset signals FRAX, FRBX, respectively. That is, the flags FAX, FBX are reset during the first access to the corresponding partial area PA in the changing operation of changing the states of all the memory cells from the second memory mode to the first memory mode, as will be described later.

When the flag FAX is set to low level, the flag circuit 30 changes the flag output signal S1AX to low level in synchronization with the decode signal XDX (XD0X, XD1X, . . . ). When the flag FBX is set to low level, the flag circuit 30 changes the flag output signal S1BX in synchronization with the decode signal XDX (XD0X, XD1X, . . . ).

The flag detection circuit 28 has latch circuits connected to flag output signals S1AX, S1BX, respectively, a multiplexer MUX1 outputting one of the flag output signals S1AX, S1BX to a node ND6 according to the low-order bit X1 of the row address signal, a delay circuit DELAY1, and a mask circuit MSK. The delay circuit DELAY1 delays only a rising edge of the row activation signal RASZ by a predetermined period of time. The mask circuit MSK outputs the flag output signal S1AX or S1BX selected by the multiplexer MUX1 as the flag detection signal FDTC. Further, the mask circuit MSK has a function of shortening an activation period of the flag detection signal FDTC when a write command is supplied. The flag detection circuit 28 outputs the flag detection signal FDTC when it detects, while accessing the pseudo SRAM, that the flag FAX or FBX is set.

Figure 14:
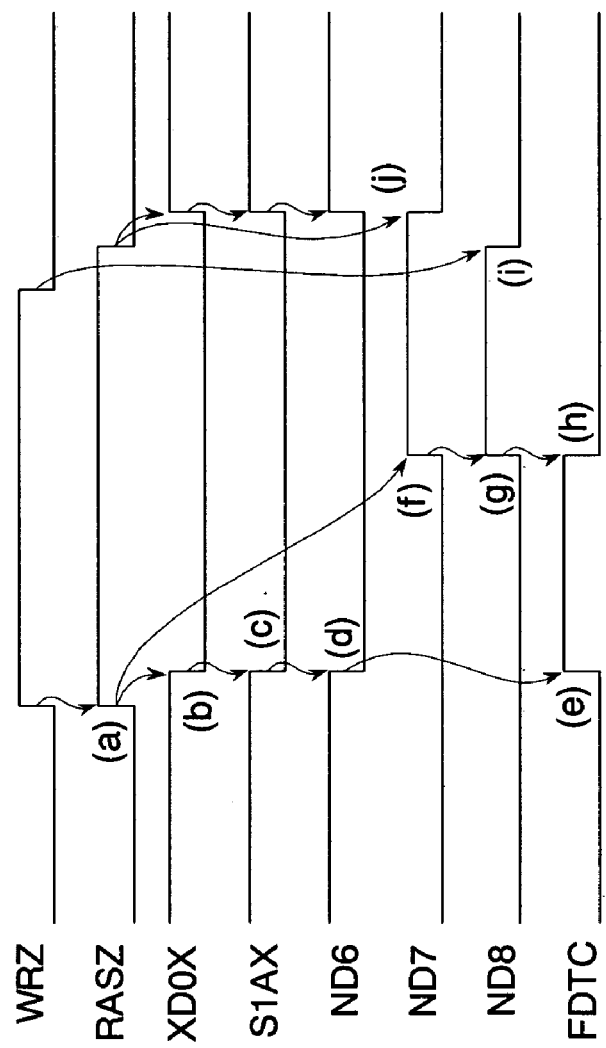
FIG. 14 is a timing chart showing operations of the flag circuit and the flag detection circuit in a normal operation mode after a partial refresh operation.

FIG. 14 shows operations of the flag circuit 30 and the flag detection circuit 28 in the normal operation mode following the partial refresh mode. This example shows a case where the flag FA0X of the flag circuit 30 is set to low level in the write operation executed in response to the write command. The decode signal X1 that is the second lowest bit changes to low level according to an address signal corresponding to the write command.

First, the row activation signal RASZ is outputted in synchronization with the write control signal WRZ responding to the write command (FIG. 14(a)) and the decode signal XD0X corresponding to the row address signal RAD2 changes to low level (FIG. 14(b)). The flag circuit 30 shown in FIG. 13 outputs the low-level flag output signal S1AX according to the flag FA0X that has been reset (FIG. 14(c)).

The multiplexer MUX1 of the flag detection circuit 28 outputs the flag output signal S1AX to the node ND6 (FIG. 14(d)). The flag detection circuit 28 activates the flag detection signal FDTC to high level in synchronization with a falling edge of the flag output signal S1AX (FIG. 14(e)).

The delay circuit DELAY1 of the flag detection circuit 28 changes a node ND7 to high level after a predetermined period of time from a rising edge of the RASZ signal (FIG. 14(f)). A node ND8 changes to high level in synchronization with the level change of the node ND7 since the WRZ signal is at high level (FIG. 14(g)). A NOR gate of the mask circuit MSK masks a voltage of the level of the node ND6 according to high level of the node ND8. Accordingly, the flag detection signal FDTC is deactivated even during the activation period of the S1AX (FIG. 14(h)).

Thereafter, the node ND8 changes to low level in synchronization with the deactivation of the WRZ signal (FIG. 14(i)). The XD0X signal, the S1AX signal, and the nodes ND6, ND7 return to the original levels in synchronization with the deactivation of the RASZ signal.

Figure 15:
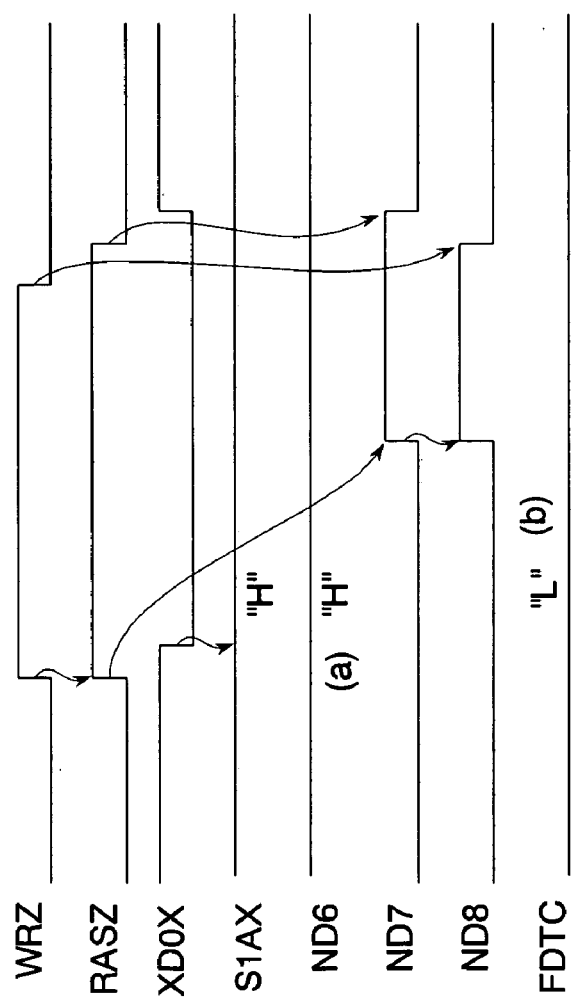
FIG. 15 is a timing chart showing other operations of the flag circuit and the flag detection circuit in the normal operation mode after the partial refresh operation.

FIG. 15 shows other operations of the flag circuit 30 and the flag detection circuit 28 in the normal operation mode following the partial refresh mode. Detailed description of the same operations as those in FIG. 14 described above will be omitted. This example shows a case where the flag FA0X of the flag circuit 30 is reset to high level in the write operation responding to the write command. Further, the decode signal X1 that is the second lowest bit changes to low level according to the address signal corresponding to the write command.

After the flag FA0X is reset to high level ("H"), the NOR gate of the flag circuit 30 maintains high level. Accordingly, the flag output signal S1AX maintains high level regardless of the activation of the decode signal XD0X (FIG. 15(a)). The high-level node ND6 is maintained at high level by the high-level flag output signal S1AX. Therefore, the flag detection signal FDTC is not outputted (FIG. 15(b)).

Figure 16:
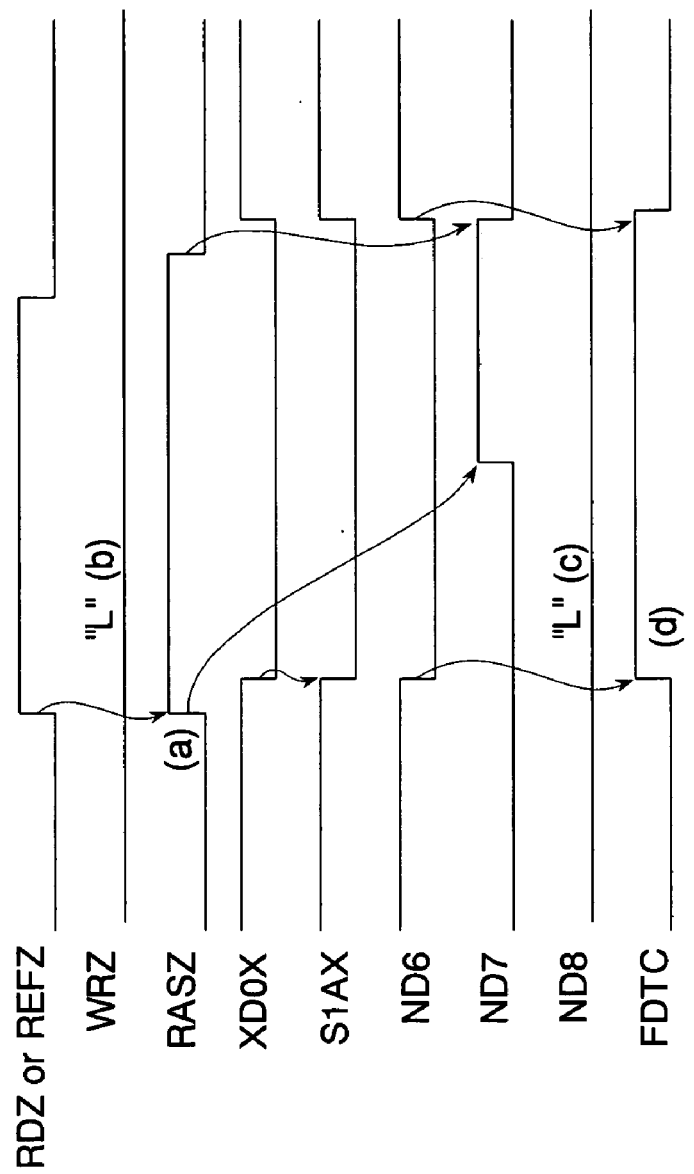
FIG. 16 is a timing chart showing other operations of the flag circuit and the flag detection circuit in the normal operation mode after the partial refresh operation.

FIG. 16 shows other operations of the flag circuit 30 and the flag detection circuit 28 in the normal operation mode following the partial refresh mode. Detailed description of the same operations as those in FIG. 14 described above will be omitted. This example shows a case where the flag FA0X of the flag circuit 30 is set to low level in the read operation responding to the read command or in the refresh operation responding to the refresh request internally generated in the pseudo SRAM. Further, the decode signal X1 that is the second lowest bit changes to low level by the address signal corresponding to the read command or the refresh address signal.

First, the row activation signal RASZ is outputted in synchronization with the write control signal WRZ responding to the read command or the refresh control signal REFZ responding to the refresh request (FIG. 16(a)), and the write control signal WRZ is not activated (FIG. 16(b)). Accordingly, the node ND8 maintains low level (FIG. 16(c)) and the mask circuit MSK does not function. Consequently, the flag detection signal FDTC is kept activated in a period corresponding to a high-level period of the RASZ signal (FIG. 16(d)).

Figure 17:
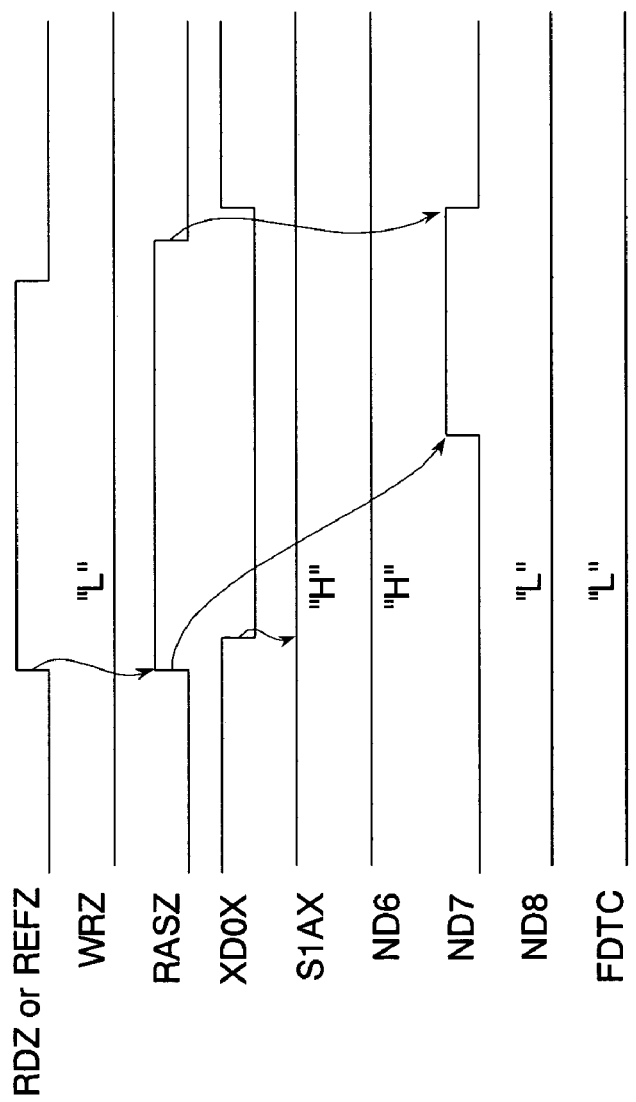
FIG. 17 is a timing chart showing other operations of the flag circuit and the flag detection circuit in the normal operation mode after the partial refresh operation.

FIG. 17 shows other operations of the flag circuit 30 and the flag detection circuit 28 in the normal operation mode following the partial refresh mode. Detailed description of the same operations as those in FIG. 14 and FIG. 15 described above will be omitted. This example shows a case where the flag FA0X of the flag circuit 30 is reset to high level in the read operation responding to the read command or in the refresh operation responding to the refresh request that is internally generated in the pseudo SRAM. Further, the decode signal X1 that is the second lowest bit changes to low level according to the address signal corresponding to the read command or the refresh address signal.

After the flag FA0X is reset to high level ("H"), the NOR gate of the flag circuit 30 maintains high level. Accordingly, the flag detection signal FDTC is not outputted as in the example shown in FIG. 15.

Figure 18:
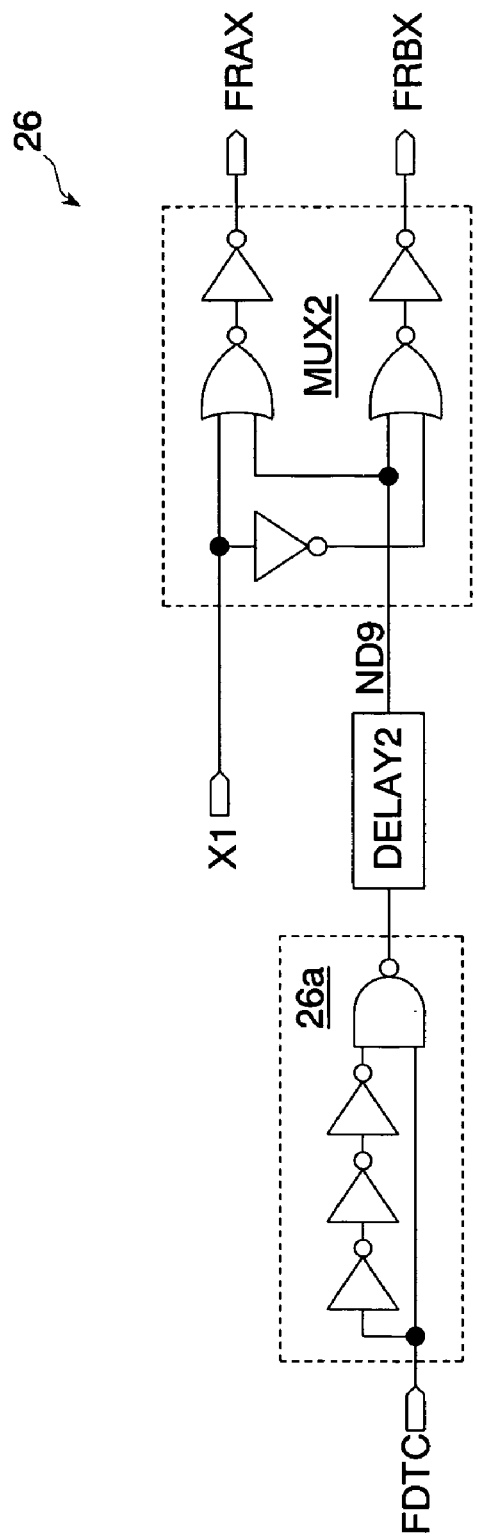
FIG. 18 is a circuit diagram showing details of a flag reset circuit shown in FIG. 1.

FIG. 18 shows details of the flag reset circuit 26 shown in FIG. 1.

The flag reset circuit 26 has a pulse generator 26a, a delay circuit DELAY2, and a multiplexer MUX2. The pulse generator 26a generates a low-level pulse in synchronization with a rising edge of the flag detection signal FDTC. The delay circuit DELAY2 delays the low-level pulse by a predetermined period of time to output it to a node ND9. The multiplexer MUX2 outputs the pulse at the node ND9 as the flag reset signal FRAX when the decode signal X1 is at low level, while outputting the pulse at the node 9 as the flag reset signal FRBX when the decode signal X1 is at high level.

Figure 19:
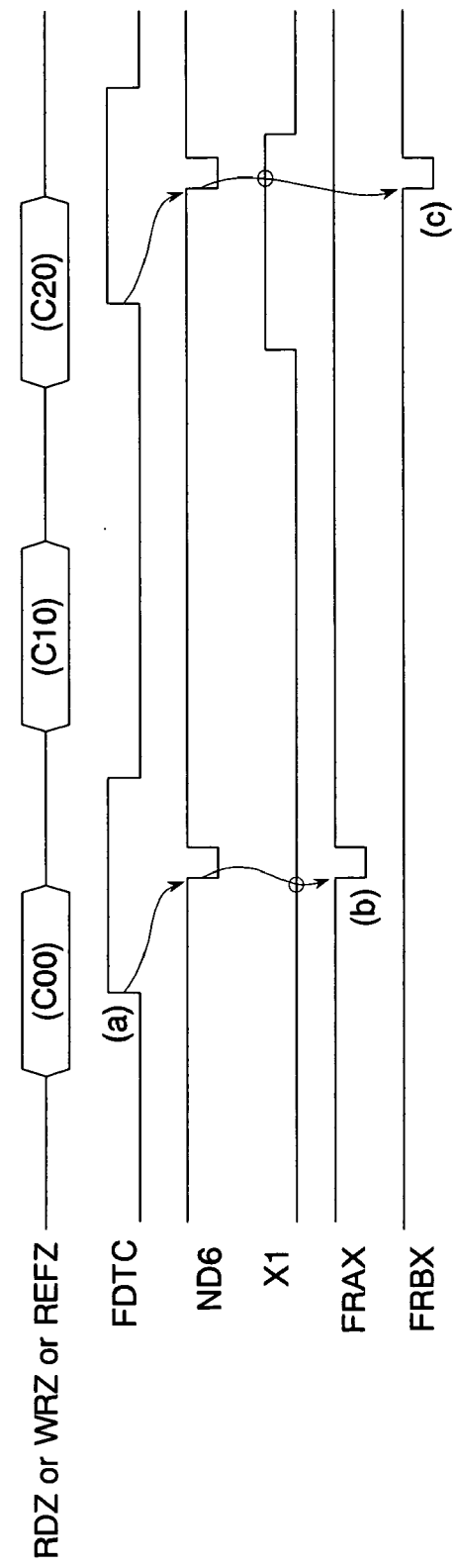
FIG. 19 is a timing chart showing operations of the flag reset circuit shown in FIG. 18.

FIG. 19 shows operations of the flag reset circuit 26 shown in FIG. 18. This example shows the normal operation mode immediately after the partial refresh mode.

As shown in FIG. 14 to FIG. 17, the flag detection signal FDTC is generated when the flag FA1X (or FB1X) is set, and is not generated when the flag FA1X (or FBX) is reset. All the flags FAX, FBX are set to low level in synchronization with the partial mode release signal PREFR after the partial refresh operation. Accordingly, the flag detection signal FDTC corresponding to each of the partial area PA is outputted in synchronization with the first access (RDZ, WRZ, RWEFZ) following the partial refresh operation (FIG. 19(a)).

The flag reset circuit 26 outputs the flag reset signal FRAX or FRBX in synchronization with the flag detection signal FDTC (FIG. 19(b, c)). Which one of the flag reset signals FRAX and FRBX is to be outputted is determined according to the level of the decode signal X1. FIG. 19 shows an example where in a certain partial area PA, the memory cell C00 is first accessed and the memory cell C01 is accessed next.

Note that the flag FAX (FA0X, FA1X, . . . ) or FBX (FB0X, FB1X, . . . ) corresponding to the decode signal XDX (XD0X, XD1X, . . . ) is reset to high level in synchronization with the pulse of the flag reset signal FRAX or FRBX.

Figure 20:
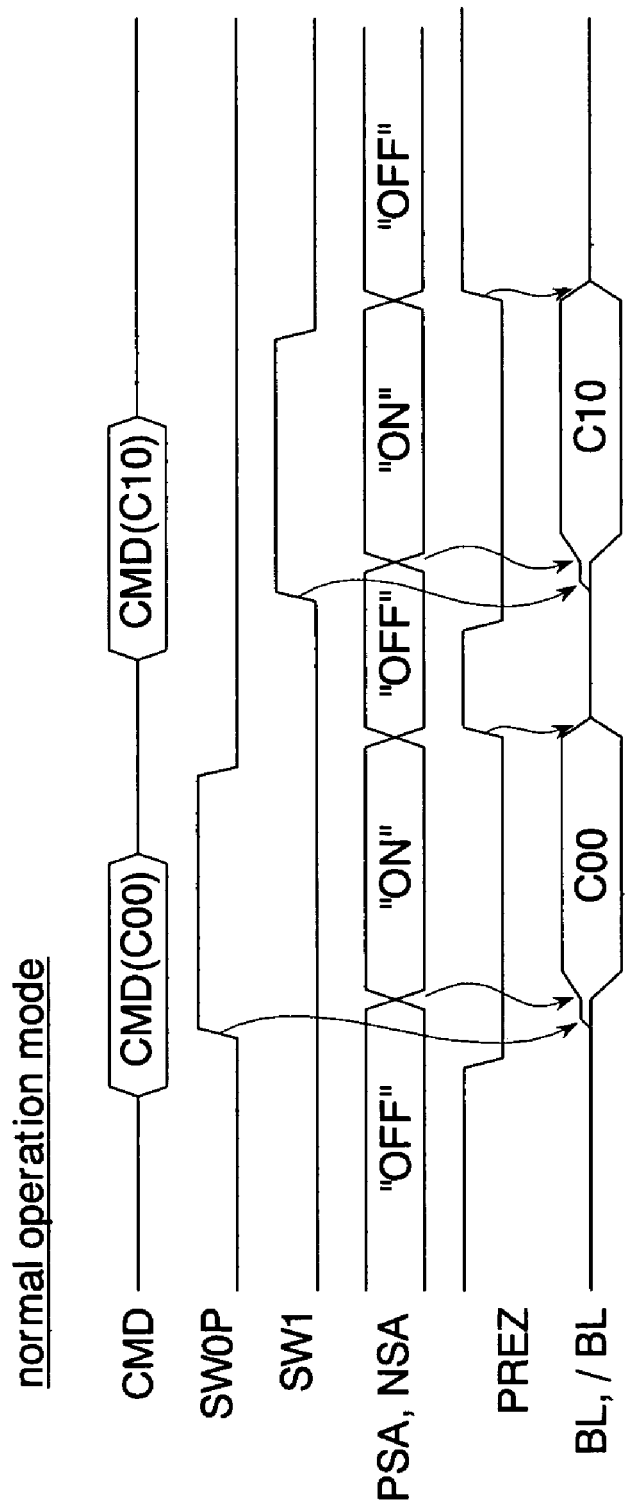
FIG. 20 is a timing chart showing operations during the normal operation mode in the first embodiment.

FIG. 20 shows operations during the normal operation mode in the first embodiment.

A command CMD putting the pseudo SRAM into operation during the normal operation mode includes access commands supplied via the external terminals (read command, write command) and a refresh command (REFZ signal from refresh command generator 16).

For example, in response to the first command CMD, the partial memory cell C00 is accessed and in response to the next command CMD, the common memory cell C10 is accessed. The word lines SW0P, SW1 are independently selected according to the row address signal RAD2. That is, in the normal operation mode, 1-bit data is stored in each memory cell connected to one word line (first memory mode, single cell operation).

When the command CMD is the read command, data amplified on the bit lines BL, /BL is outputted to an external part via the data bus DB. When the command CMD is the write command, data supplied via the external terminal is amplified in the write amplifier WA and the sense amplifier SA to be written to the memory cell. When the command CMD is the refresh command, data amplified in the sense amplifier SA is written back to the memory cell.

Figure 21:
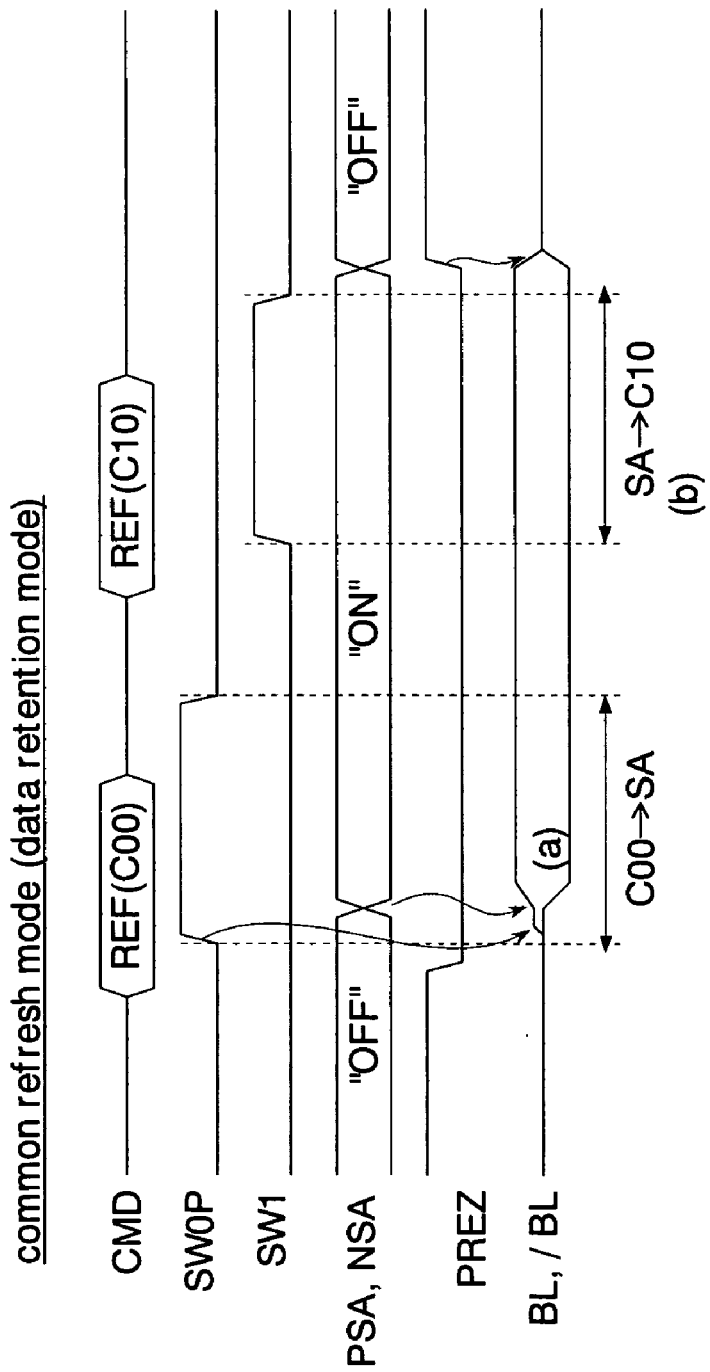
FIG. 21 is a timing chart showing operations during a common refresh mode in the first embodiment.

FIG. 21 shows operations during the common refresh mode (=data retention mode, low power consumption mode) in the first embodiment. In the common refresh mode, the acceptance of an external access command is prohibited. The pseudo SRAM operates in response only to the internally generated refresh command REF.

In the common refresh mode, the partial memory cell C00 is first accessed and data retained in the partial memory cell C00 is latched by the sense amplifier SA (FIG. 21(a)). Next, while the sense amplifier SA is kept activated, the common memory cell C10 is accessed, and the data latched in the sense amplifier SA (complementary data) is written to the partial memory cell C00 and the common memory cell C10 (FIG. 21(b)). Accordingly, the partial memory cell C00 and the common memory cell C10 retain complementary data. Then, all the partial areas PA (memory cell groups) are subjected to the above operation. That is, 1-bit data is stored in the plural memory cells (for example, C00 and C10) in the memory cell group connected to the two word lines SW0P, SW1 (second memory mode, twin cell operation).

Figure 22:
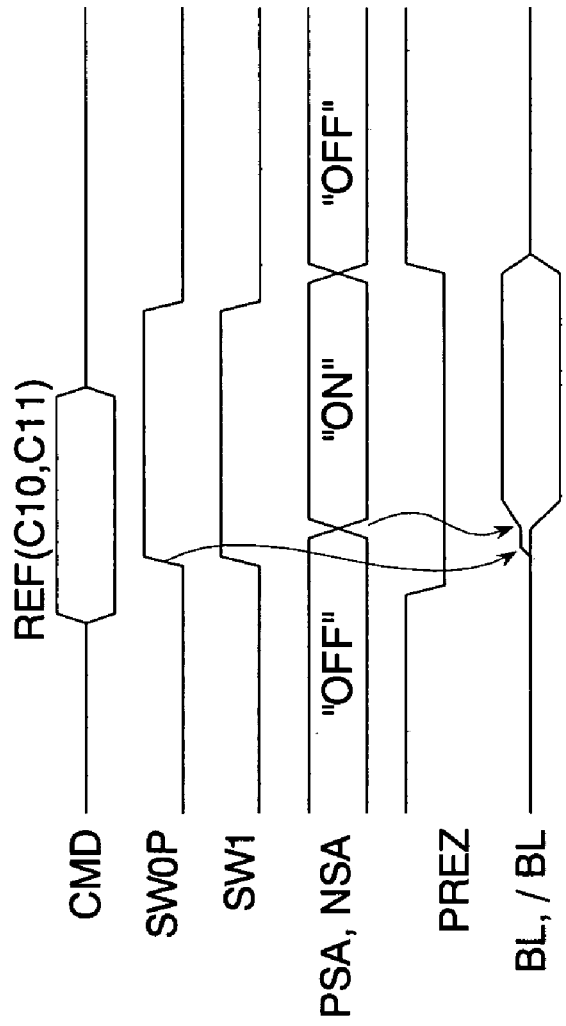
FIG. 22 is a timing chart showing operations during a partial refresh mode in the first embodiment.

FIG. 22 shows operations during the partial refresh mode (data retention mode, low power consumption mode) in the first embodiment. In the partial refresh mode, the acceptance of an external access command is prohibited as in the common refresh mode. The pseudo SRAM operates in response only to the internally generated refresh command REF.

In the partial refresh mode, the partial word line SW0P and the common word line SW1 are concurrently selected, and complementary data retained in the partial memory cell C00 and the common memory cell C10 are amplified concurrently in the sense amplifier SA to be written back to the memory cells C00, C10 (twin cell operation). That is, 1-bit data is stored in the plural memory cells (for example, C00, C10) in the memory cell group connected to the two word lines SW0P, SW1 (second memory mode). The data is retained in the partial memory cell C00 and the common memory cell C10, so that the refresh cycle can be greatly lengthened.

In the partial refresh mode, in accordance with the lengthened refresh cycle, an amount of electric charges retained in one memory cell immediately before the refresh operation is smaller than that in the normal operation mode. Therefore, there is a risk that data in the memory cell which was refreshed a certain period of time ago cannot be correctly read (data loss) in the normal operation mode following the partial refresh mode. In the present invention, the data loss is prevented by a special method taken when the first access to each memory cell is made in the normal operation mode following the partial refresh mode, as will be shown in FIG. 24 to FIG. 26, which will be described later.

Figure 23:
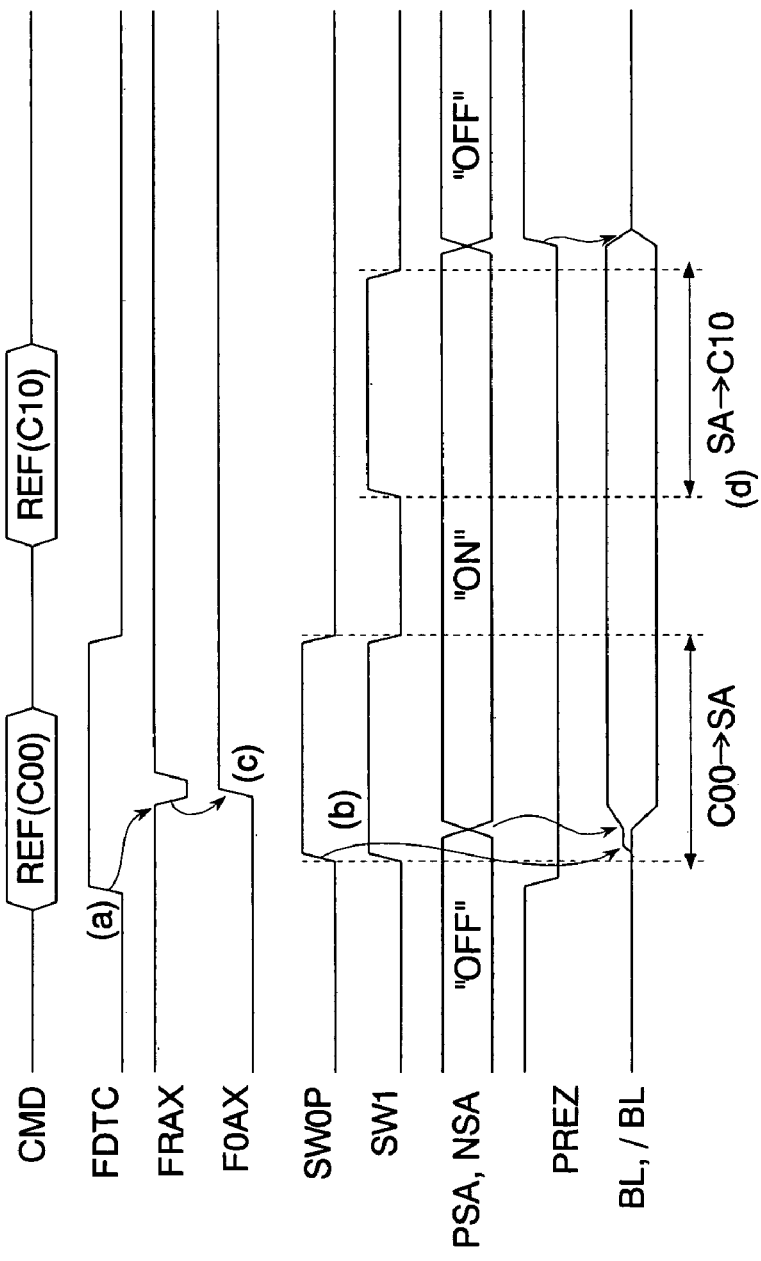
FIG. 23 is a timing chart showing operations when the operation mode shifts from the normal operation mode to a low power consumption mode again in the first embodiment.

FIG. 23 shows operations when, in the normal operation mode following the partial refresh mode in the first embodiment, the CE signal changes to low level before all the flags FAX, FBX are reset, so that the operation mode shifts from the normal operation mode to the data retention mode (low power consumption mode) again.

When detecting the set state of the flags FAX, FBX, the flag detection circuit 28 shown in FIG. 13 outputs the flag detection signal FDTC irrespective of the operation mode. Accordingly, the flag detection signal FDTC is outputted even in the common refresh mode (FIG. 23(a)).

The activation of the flag detection signal FDTC causes the word decoder WDEC to concurrently select the pair of the sub word lines SW0P, SW1 corresponding to the partial area PA as in the case in FIG. 22 (FIG. 23(b)). The flag reset circuit shown in FIG. 18 outputs the flag reset signal FRAX in response to the flag detection signal FDTC to reset the flag F0AX to high level (FIG. 23(c)).

For the refresh operation in the common refresh mode, the sub word line SW1 is selected again while the sense amplifier SA is activated, and data latched in the sense amplifier SA is written to the memory cell C10 (FIG. 23(d)). This operation is redundant and is not required. However, since this operation causes no problem in operation and can prevent the complication of the circuit, the redundant operation is permitted.

Figure 24:
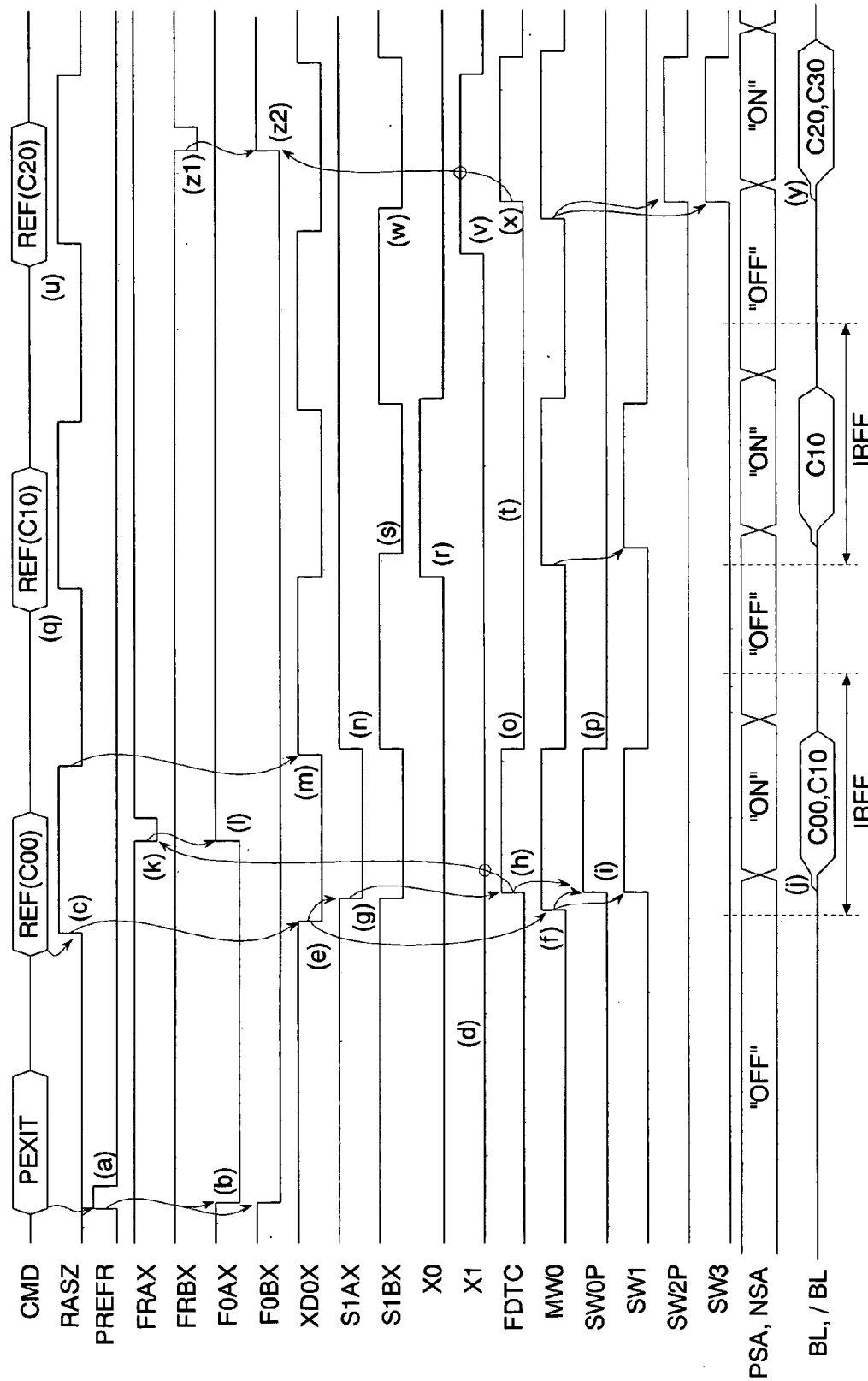
FIG. 24 is a timing chart showing an example where refresh requests are generated in sequence after the return to the normal operation mode.
Figure 25:
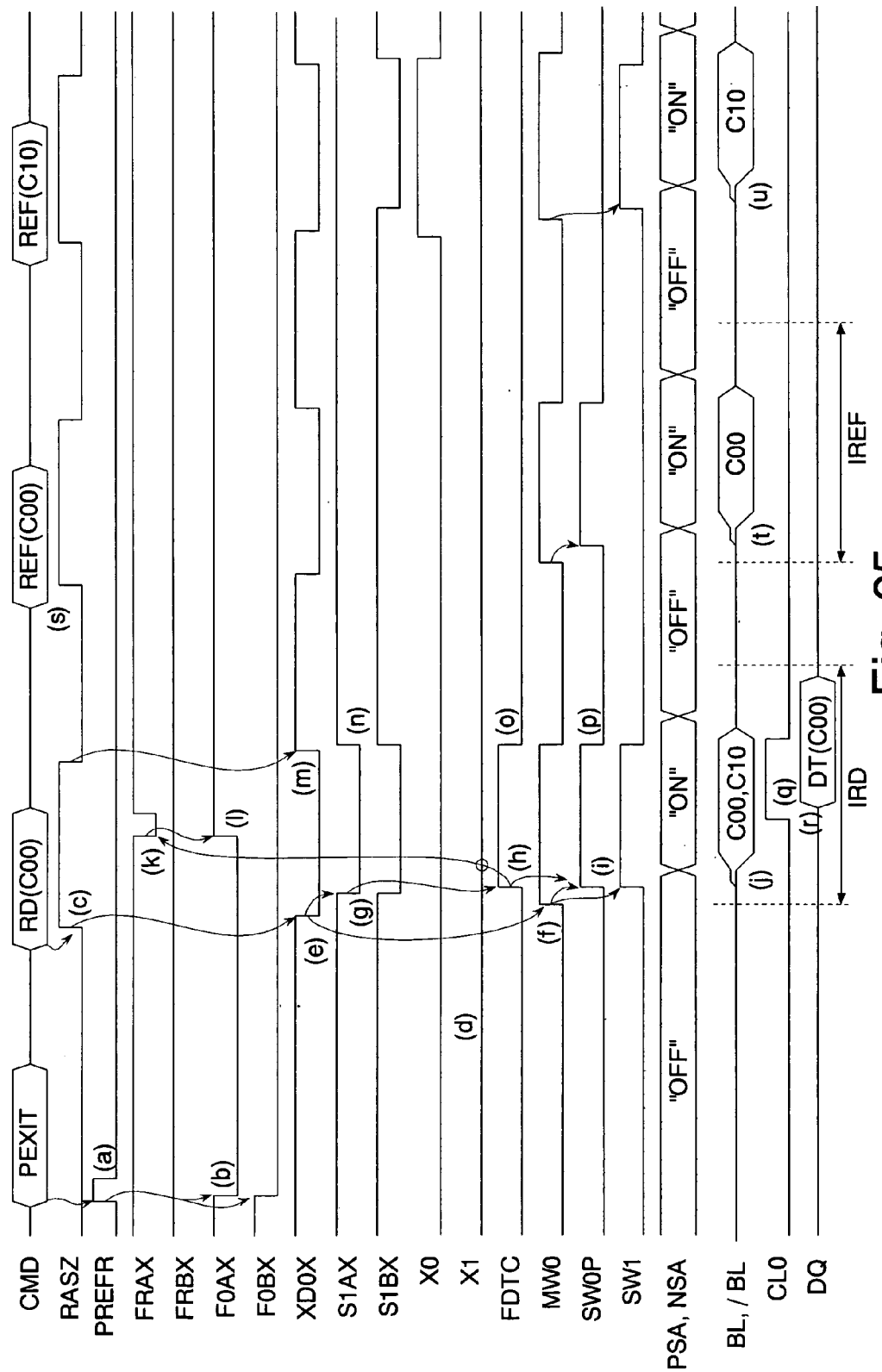
FIG. 25 is a timing chart showing an example where a read command is supplied prior to the first refresh request after the return to the normal operation mode.
Figure 26:
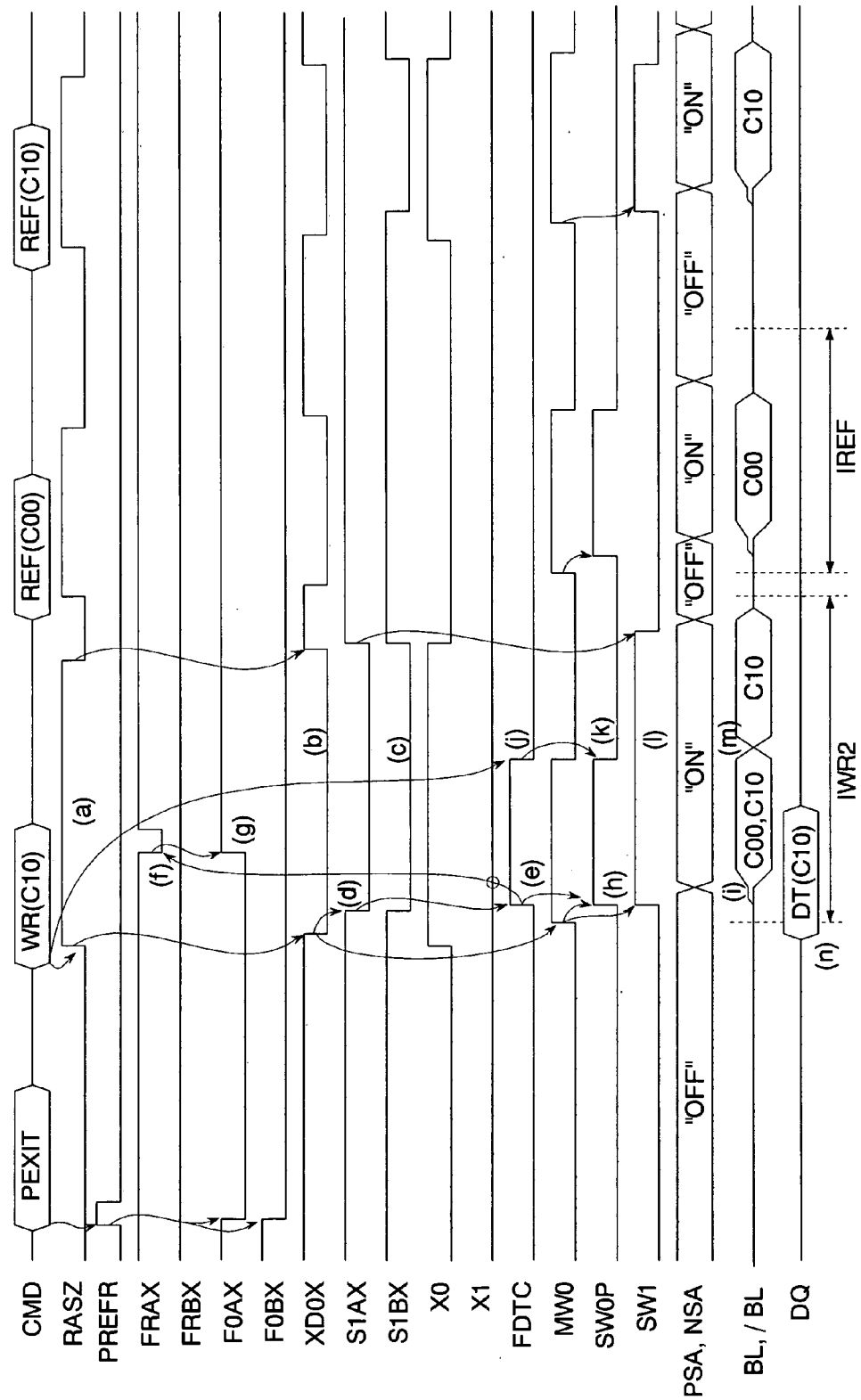
FIG. 26 is a timing chart showing an example where a write command is supplied prior to the first refresh request after the return to the normal operation mode.

FIG. 24 to FIG. 26 show operations in the normal operation mode after the release from the low power consumption mode. An amount of the electric charges retained in each memory cell in the memory cell pair refreshed by the twin cell operation during the low power consumption mode is not sometimes large enough for the single cell operation. Therefore, at the time of the return from the low power consumption mode to the normal operation mode (at the time of the operation mode change), it is necessary to put all the partial memory cells into the twin cell operation once, to thereby compensate the lack of the amount of the electric charges retained in the memory cell capacitor.

Before the present invention was made, a change period for putting all the partial memory cells into the twin operation once was required. This disabled an external system from accessing the pseudo SRAM during this period. In the present invention, after the operation mode change, the flags FAX, FBX are utilized to put a memory cell, which is to be accessed first in each of the partial areas PA, into the twin cell operation, so that there is no need for the change period. Therefore, the external system is capable of making a read access and a write access to the pseudo SRAM immediately after the return to the normal operation mode, without being aware of the twin cell operation. A method therefor will be described below.

FIG. 24 shows an example where the refresh requests REF are sequentially generated after the return to the normal operation mode.

First, the command decoder 10 shown in FIG. 1 receives a release command PEXIT of the data retention mode (low power consumption mode) from an external part of the pseudo SRAM to output the partial mode release signal PREFR (FIG. 24(a)). The output of the partial mode release signal PREFR causes the pseudo SRAM to return to the normal operation mode from the low power consumption mode. The flag circuit 30 shown in FIG. 13 sets the flags FAX (F0AX, F1AX, . . . ), FBX (F0BX, F1BX, . . . ) to low level in synchronization with the pulse of the partial mode release signal PREFR (FIG. 24(b)).

Next, the refresh command REF (REFZ signal) is internally generated in the pseudo SRAM, and the timing control circuit 38 shown in FIG. 1 outputs the RASZ signal (FIG. 24(c)). At this time, the refresh address counter 18 is outputting the refresh address signal REFAD selecting the memory cell C00. Specifically, the two low-order bits X1, X0 of the row address signal are both at low level (FIG. 24(d)). The word decoder WDEC shown in FIG. 13 outputs the decode signal XD0X and a main word line signal MW0 corresponding to the memory cell C00, in response to the RASZ signal (FIG. 24(e, f)).

The flag circuit 30 outputs the contents of the flags F0AX, F0BX as the flag output signals S1AX, S1BX in synchronization with the decode signal XD0X (FIG. 24(g)). The flag detection circuit 28 selects the flag output signal S1AX according to the bit X1 of the row address signal to output it as the flag detection signal FDTC (FIG. 24(h)). The ¼ word decoder 44 shown in FIG. 9 changes the two bits X00, X01 of the decode signal to high level when receiving the flag detection signal FDTC. Then, the two sub word lines SW0P, SW1 are concurrently selected (FIG. 24(*i*)), and the twin cell refresh operation for the memory cells C00, C10 is executed (FIG. 24(*j*)). Then, data is written back to the memory cells C00, C10 from which the common data was read. This prevents the loss of the data retained in the memory cell C00 during the low power consumption mode. "ON" and "OFF" of the sense amplifier activation signals PSA, NSA represent the activation and deactivation of the sense amplifier SA, respectively.

Note that an internal refresh cycle time IREF which is an operation time of the memory core 34 in the refresh operation is set to the same length as that of an internal refresh cycle time in the normal operation mode.

The flag reset circuit 26 shown in FIG. 18 outputs the flag reset signal FRAX corresponding to the bit X1 in synchronization with the flag detection signal FDTC (FIG. 24(*k*)). The flag circuit 30 shown in FIG. 13 resets the flag F0AX corresponding to the decode signal XD0X to high level in response to the flag reset signal FRAX (FIG. 24(*l*)). By resetting the flag F0AX, the memory cells in the corresponding partial area PA are accessed in the first memory mode (single cell operation) thereafter.

In accordance with the deactivation of the RASZ signal, the decode signal XD0X is deactivated and the flag output signals S1AX, S1BX are precharged to high level (FIG. 24(*m, n*)). By the precharge of the flag output signals S1AX, S1BX, the flag detection signal FDTC is deactivated to low level (FIG. 24(*o*)). In accordance with the deactivation of the flag detection signal FDTC, the main word line MW0 and the sub word lines SW0P, SW1 are unselected (FIG. 24(*p*)).

Next, the refresh command REF (REFZ signal) is generated (FIG. 24(*q*)). The refresh address counter 18 has been incremented and is outputting the refresh address signal REFAD selecting the memory cell C10. Accordingly, the bit X0 of the row address signal changes to high level (FIG. 24(*r*)).

The flag FA0X corresponding to the memory cell C10 has been reset to high level by the previous refresh operation. Therefore, when the decode signal XD0X is activated, the flag circuit 30 changes only the flag output signal S1BX to low level, and the flag output signal S1AX is maintained at high level (FIG. 24(*s*)). Since the flag output signal S1AX corresponding to a refresh address (X1="0") is at high level, the flag detection signal FDTC is not outputted (FIG. 24(*t*)). Accordingly, only one sub word line SW1 is selected and the normal refresh operation (single cell operation) in the first memory mode is executed. Note that data in the memory cell C10 is not complemented during the low power consumption mode. Therefore, as far as the example in FIG. 24 is concerned, data retained by this refresh operation does not have any special significance.

The refresh cycle time IREF of the single cell refresh operation is set to the same length as that of the refresh cycle time IREF of the twin cell refresh operation. Setting the refresh cycle times IREF to the same length makes it possible to simplify the configuration of the timing control circuit 38 of the core control circuit 32.

Next, the refresh command REF (REF signal) is generated (FIG. 24(*u*)). The refresh address counter 18 has been incremented and is outputting the refresh address signal REFAD selecting the memory cell 20. Accordingly, the bit X1 of the row address signal changes to high level (FIG. 24(*v*)).

The flag FB0X is set to low level. Accordingly, the flag output signal S1BX changes to low level as in the above-described operation (FIG. 24(*w*)). The flag detection circuit 28 selects the flag output signal S1BX according to the bit X1 of the row address signal to output it as the flag detection signal FDTC (FIG. 24(*x*)). Then, the two sub word lines SW2P, SW3 are concurrently selected and the twin cell refresh operation for the memory cells C20, C30 is executed (FIG. 24(*y*)). Thereafter, in synchronization with the flag detection signal FDTC, the flag reset signal FRBX is outputted and the flag F0AX is reset to high level (FIG. 24(*z1, z2*)).

FIG. 25 shows an example where the read command RD is supplied prior to the first refresh request REF after the return to the normal operation mode. Since the operations up to the amplification of data on the bit lines BL, /BL in response to the read command RD (FIG. 25(*a*) to (*p*)) are the same as those in FIG. 24 described above, the same reference symbols are used.

After data retained in the memory cells C00, C10 by the twin cell operation are amplified in the sense amplifier SA, the column decoder CDEC shown in FIG. 1 decodes the column address signal CAD and activates the column selection signal CL0 corresponding to the memory cell C00 shown in FIG. 9 for a predetermined period of time (FIG. 25(*q*)). The column selection signal CL0 causes the corresponding column switch CSW to turn on, so that the complementary bit lines BL, /BL are selectively connected to the data bus line DB. Then, the data retained in the memory cell C00 is amplified in the sense buffer SB and is thereafter outputted from the data input/output terminal DQ via the common data bus line CDB (FIG. 25(*r*)).

The operation time of the memory core 34 in the read operation is represented by an internal read cycle time IRD. The internal read cycle time IRD has the same length in the data retention mode and the normal operation mode. Further, the internal read cycle time IRD is the same in length as the internal refresh cycle time IREF which is the operation time of the memory core 34 in the refresh operation and as an internal write cycle time IWR1 (later-described FIG. 28) which is the operation time of the memory core 34 in the write operation. The internal write cycle time IWR1 is the time for a write operation not including the twin cell operation and has the same length both in the retention mode and the normal operation mode. The time for a write operation including the twin cell operation is represented by an internal write cycle time IWR2 (later-described FIG. 26).

After the read command RD, the refresh command REF corresponding to the memory cell C00 is generated (FIG. 25(*s*)). The flag F0AX has been reset to high level by the twin cell operation corresponding to the read operation. Accordingly, the single cell operation in the first memory mode is executed as in FIG. 24(*q*) to (*t*) (FIG. 25(*t*)). Similarly, the refresh operation corresponding to the memory cell C10 is also the single cell operation (FIG. 25(*u*)).

FIG. 26 shows an example where the write command WR is supplied prior to the first refresh request REF after the return to the normal operation mode. In other words, FIG. 26 shows a write operation to the partial area PA corresponding to the flags FAX (F0AX, F1AX, . . . ), FBX (F0BX, F1BX, . . . ) in a set state.

When the flags FAX, FBX are in a set state, the write operation is executed in the internal write cycle time IWR2. In the internal write cycle time IWR2, the activation period of the RASZ signal is set longer than that in the internal write cycle time IWR1 (FIG. 26(*a*)). In compliance with the activation period of the RASZ signal, output periods of the decode signal XD0X and the flag output signals S1AX, S1BX are also lengthened (FIG. 26(b, c)).

The internal write cycle time IWR2 includes one refresh cycle and one write cycle as shown below. The sense amplifier SA is kept activated through the refresh cycle and the write cycle. This can lower the frequency of activating the sense amplifier, and the internal write cycle time IWR2 can be made shorter than the sum of the refresh cycle time IREF and the write cycle time IWR1. For example, the internal write cycle time IWR2 can be 1.5 to 1.7 times the length of the write cycle time IWR1.

The operation of outputting the flag output signals S1AX, S1BX according to the decode signal XD0X (FIG. 26(d)) to activate the flag detection signal FDTC (FIG. 26(e)), and the operation of outputting the flag reset signal FRAX in response to the activation of the flag detection signal FDTC (FIG. 26(f)) to reset the flag FA0X (FIG. 26(g)) are the same as those in FIG. 24 described above. Further, the activation of the flag detection signal FDTC causes the sub word lines SW0P, SW1 to be concurrently activated (FIG. 26(h)), and the twin cell operation is started (FIG. 26(i)). Then, data is written back to the memory cells C00, C10 from which the common data are read.

The flag detection circuit 28 shown in FIG. 13 changes the node ND8 to high level after the delay time of the delay circuit DELAY1 from the activation of the RASZ signal to deactivate the flag detection signal FDTC irrespective of the flag output signal S1AX (FIG. 26(j)). The ¼ word decoder 44 shown in FIG. 10 makes the decode signal X00 unselected in response to the deactivation of the flag detection signal FDTC. Accordingly, the sub word line SW0P (X0="0") is unselected (FIG. 26(k)). As a result, the twin cell operation is finished and only the sub word line SW1 (X0="1") is kept selected (FIG. 26(l)). Thus, the ¼ word decoder 44 operates as a word control circuit that makes, during the activation of the sense amplifier SA, the sub word line SW0P unselected, which is connected to the memory cell C00 in the partial area PA not designated as a write target. The sense amplifier SA is kept activated in a period during which the sub word line SW1 is selected.

Thereafter, write data DT is supplied to the bit lines BL, /BL via the data bus line DB, and the data is written only to the memory cell C10 connected to the selected sub word line SW1 (FIG. 26(m)). That is, the write operation is executed in response to the write command WR and new data is written to the memory cell C10 designated as the write target. Note that the write data DT is supplied to the data input/output terminal DQ in synchronization with the write command WR (FIG. 26(n)).

Thus, after the data retained in the memory cell C00 is refreshed by the twin cell operation, the data is written to the memory cell C10, which enables the direct shift from the low power consumption mode to the normal operation mode without causing any loss of the data in the memory cell C00. Thereafter, as in FIG. 25, the single cell refresh operations corresponding to the memory cell C00 and the memory cell C10 are sequentially executed (FIG. 26(o, p)).

Figure 27:
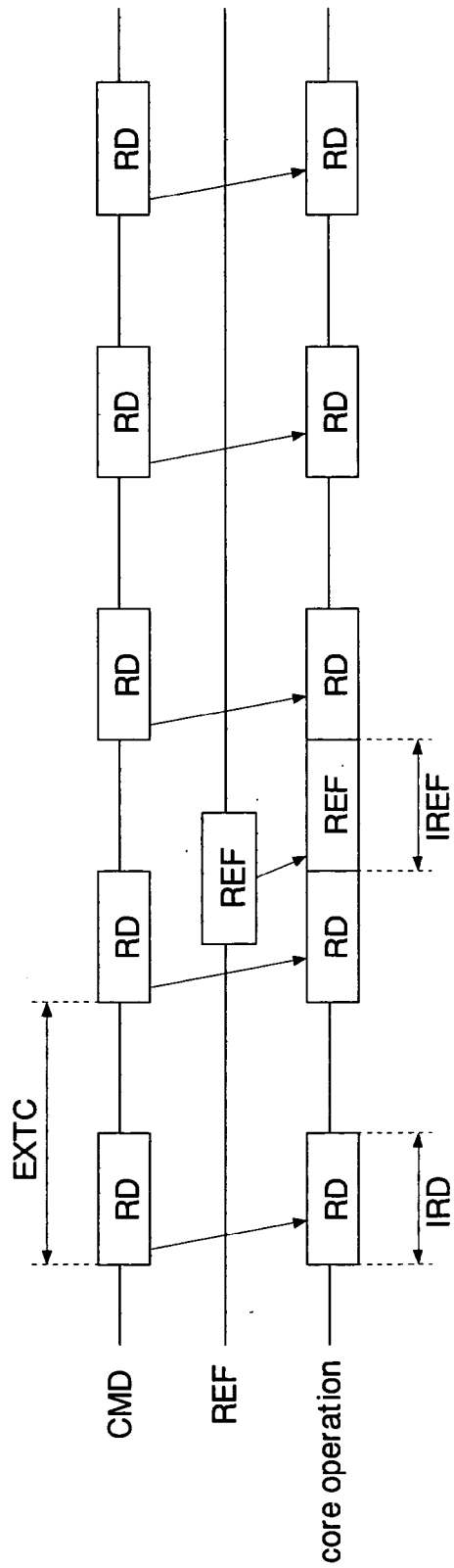
FIG. 27 is an explanatory chart showing the relation between an external command cycle time EXTC and an internal read cycle time IRD.
Figure 28:
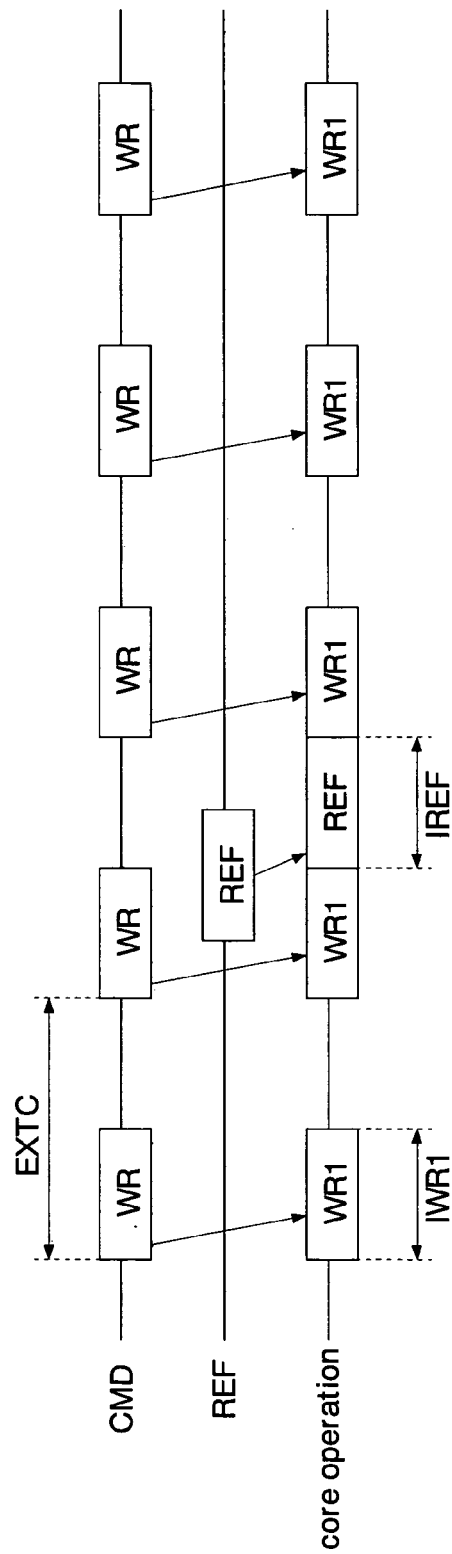
FIG. 28 is an explanatory chart showing the relation between the external command cycle time EXTC and an internal write cycle time IWR1.
Figure 29:
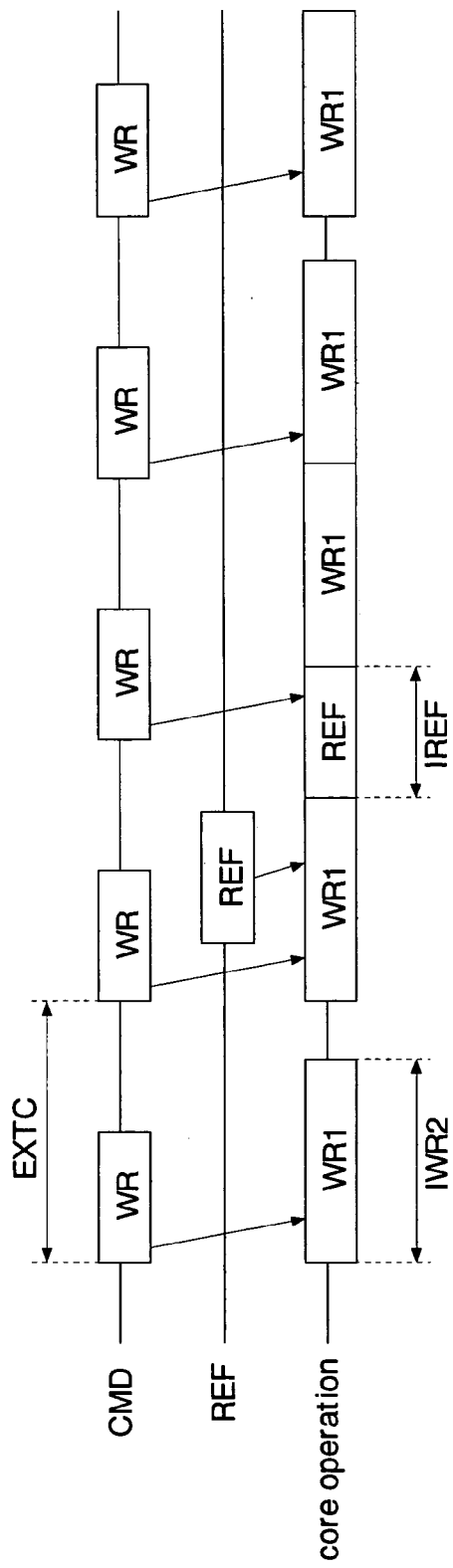
FIG. 29 is an explanatory chart showing the relation between the external command cycle time EXTC and an internal write cycle time IWR2.

FIG. 27 to FIG. 29 show a method of executing the refresh operation in the normal operation mode while the external system does not recognize it. By this method, the pseudo SRAM having the DRAM memory core operates as a SRAM.

FIG. 27 shows the relation between an external command cycle time EXTX and the internal read cycle time IRD.

The external command cycle time EXTC is a supply cycle of an operation command (in this example, the read command RD) supplied from an external part of the pseudo SRAM. In this embodiment, the external command cycle time EXTC is set to a value equal to the sum of the internal read cycle time IRD (or write cycle time IWR1) and the internal refresh cycle time IREF. This ensures that the internal refresh cycle time IREF is inserted between the internal read cycle times IRD even when the read command RD is continuously supplied at the minimum cycle.

FIG. 28 shows the relation between the external command cycle time EXTC and the internal write cycle time IWR1.

Since the internal write cycle time IWR1 is equal in length to the internal read cycle time IRD, the external command cycle time EXTC is set to a value equal to the sum of the internal write cycle time IWR1 and the internal refresh cycle time IREF. This ensures that the internal refresh cycle IREF is inserted between the internal write cycle times IWR1, even when the write command WR is continuously supplied at the minimum cycle.

FIG. 29 shows the relation between the external command cycle time EXTC and the internal write cycle time IWR2.

The external command cycle time EXTC is set to a value shorter than the sum of the internal write cycle time IWR2 and the internal refresh cycle time IREF. As described in FIG. 26, the internal write cycle time IRW2 including the twin cell refresh operation is longer than the internal write cycle time IWR1. Therefore, when the internal refresh cycle IREF is inserted between the write commands WR continuously supplied at the minimum cycle, the internal write cycle IWR2 is temporarily delayed. However, as the internal write cycle IWR2 is repeated several times, the deviation from the write command WR is eliminated. As a result, even when the internal write cycle IWR2 including the twin cell operation continuously takes place, it is possible to execute the refresh operation while the external system does not recognize it.

Figure 30:
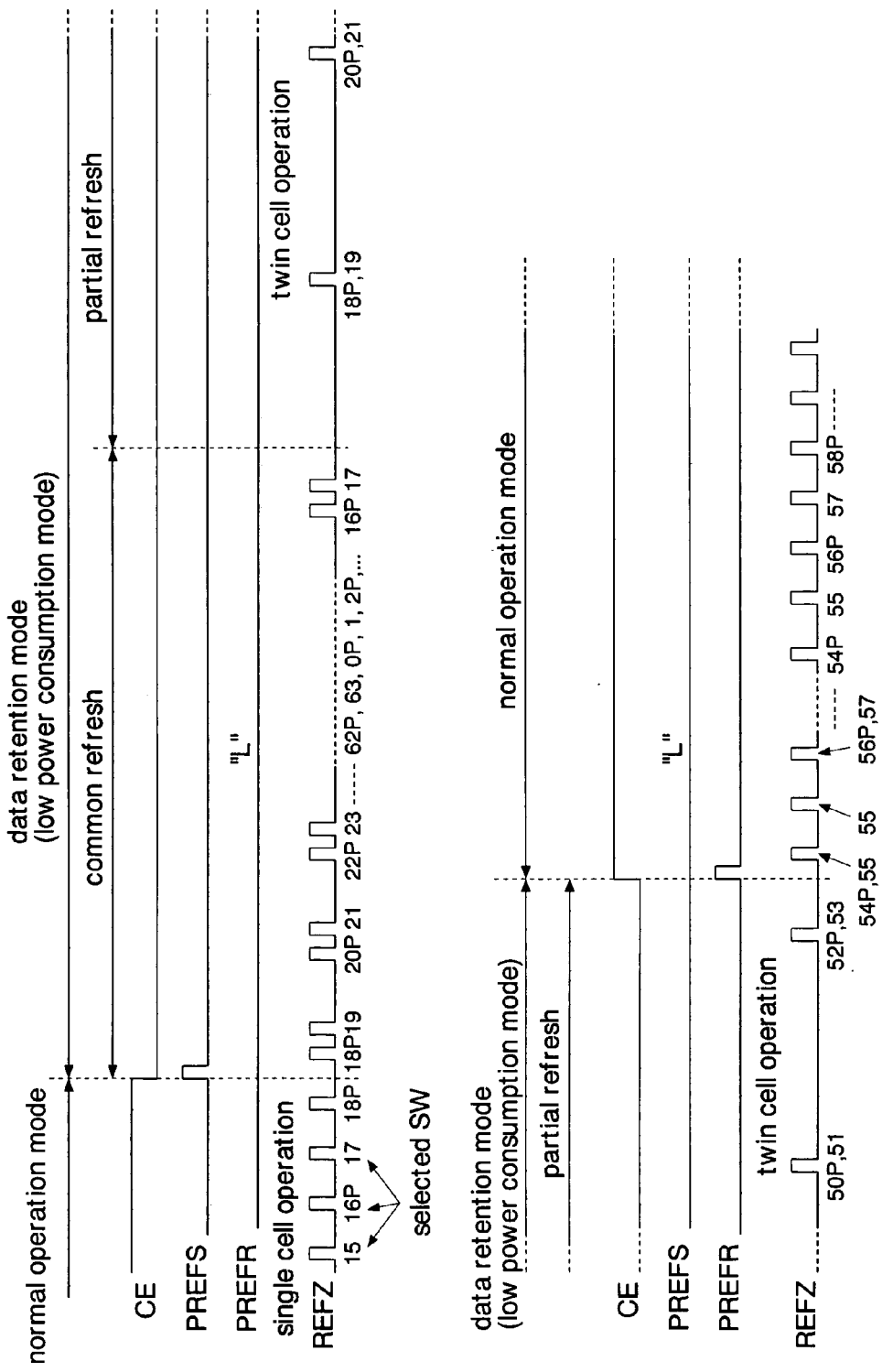
FIG. 30 is a timing chart showing operations of a pseudo SRAM in the first embodiment.

FIG. 30 shows operations of the pseudo SRAM of the first embodiment. The lower timing chart in the drawing shows a continuation of the upper timing chart in the drawing.

In the normal operation mode, one sub word line SW is selected in response to the refresh control signal REFZ (single cell operation). When the CE signal changes to low level to change the normal operation mode to the common refresh mode, in order to first select the partial word line SWP, the reset circuit 18a of the refresh address counter 18 shown in FIG. 6 resets the counter 18b that generates the lowest-order bit X0 of the row address signal RAD2, in synchronization with the rising edge of the mode signal MODE2.

After all the partial word lines SWP are selected, the operation mode shifts from the common refresh mode to the partial refresh mode. In the partial refresh mode, the twin cell operation (refresh operation) selecting the two adjacent sub word lines SW based on the single refresh control signal REFZ is executed.

When the CE signal changes to high level during the partial refresh mode, the operation mode shifts directly to the normal operation mode. After the change to the normal operation mode, the twin cell operation or the single cell operation is executed according to the flags FAX, FBX.

In this embodiment described above, during the data retention mode, data is retained in the plural memory cells in the second memory mode which is the combination of the so-called partial technology and twin cell technology, so that the data retention time can be made longer compared with that in the first memory mode. As a result, it is possible to greatly lower the refresh frequency of the memory cells, resulting in great reduction in power consumption during the data retention mode.

The flags FAX, FBX indicating the memory mode of the memory cells are formed for each of the partial areas PA, and the first access is necessarily executed in the second memory mode in each of the partial areas PA. This can prevent the loss of data in the accessed memory cell.

The flags FAX, FBX indicating the memory mode of the memory cells are formed for each of the partial areas PA, and at the time of the change from the data retention mode to the normal operation mode, the memory cells are accessed according to the flags FAX, FBX. This allows a system managing the pseudo SRAM to freely access any memory cell even during the changing operation. The practical time required for the change becomes zero. As a result, the system managing the pseudo SRAM is capable of accessing the pseudo SRAM immediately after the return to the normal operation mode from the data retention mode. This enables immediate return to an operation mode from a standby state when, for example, the pseudo SRAM is used as a work memory of a cellular phone.

The flag circuit 30 sets all the flags FAX, FBX immediately before the changing operation from the data retention mode to the normal operation mode. This can ensure that the memory mode of the memory cells of all the partial areas PA is changed from the second memory mode to the first memory mode.

The states of the flags FAX, FBX are detected by the flag detection circuit 28, so that the operation of the ¼ word decoder 44 of the word decoder WDEC can be easily controlled, which can simplify circuitry.

When the first access after the return to the normal operation mode is the write operation, data is written by the single cell operation after the refresh operation is executed by the twin cell operation. This can ensure that the data in the memory cells in the partial area PA to which data write is not executed are retained and data is written to a predetermined memory cell. The external system is capable of executing the write operation to the pseudo SRAM immediately after the return to the normal operation mode. That is, a high-speed operation of the system is enabled.

When the first access immediately after the return to the normal operation mode is the write operation, the sense amplifier SA is kept activated and the twin cell refresh operation and the single cell write operation are executed. This can lower the activation frequency of the sense amplifier SA to shorten the internal write cycle time IWR2.

In the first write operation after the return to the normal operation mode, the word lines connected to the memory cells not designated as the write target are unselected while the sense amplifier SA is kept activated. Therefore, with a simple control, it is possible to execute the twin cell operation (operation of writing back data in the second memory mode) and the single cell operation (operation of writing data in the first memory mode) while the sense amplifier SA is kept activated.

When the first access after the return to the normal operation mode is the read operation, the refresh operation is executed by the twin cell operation and the amplified read data is outputted to the data input/output terminal DQ. This allows the external system to execute the read operation from the pseudo SRAM immediately after the return to the normal operation mode. That is, a high-speed operation of the system is enabled.

When the first access following the return to the normal operation mode is the refresh operation, the refresh operation is executed by the twin cell operation. Owing to the refresh operation of writing back data, the data are firmly written to the memory cells that have been accessed for the refresh operation. Therefore, even when the single cell operation is executed for each of the memory cells (access in the first memory mode), the data can be surely read or refreshed.

At the shift from the normal operation mode to the data retention mode, the common refresh operation of reading data stored in the partial memory cell and writing the read data to all the memory cells in the partial area PA is executed every time the refresh command is generated until all the partial areas PA are brought into the second memory mode state. Owing to the common refresh operation, the data stored in the partial memory cells in the first memory mode can be stored in the second memory mode in the memory cells of the memory cell group. The memory cells in the first memory mode are converted to the memory cells in the second memory mode every time the refresh operation is executed, efficient shift from the normal operation mode to the data retention mode is enabled.

Figure 31:
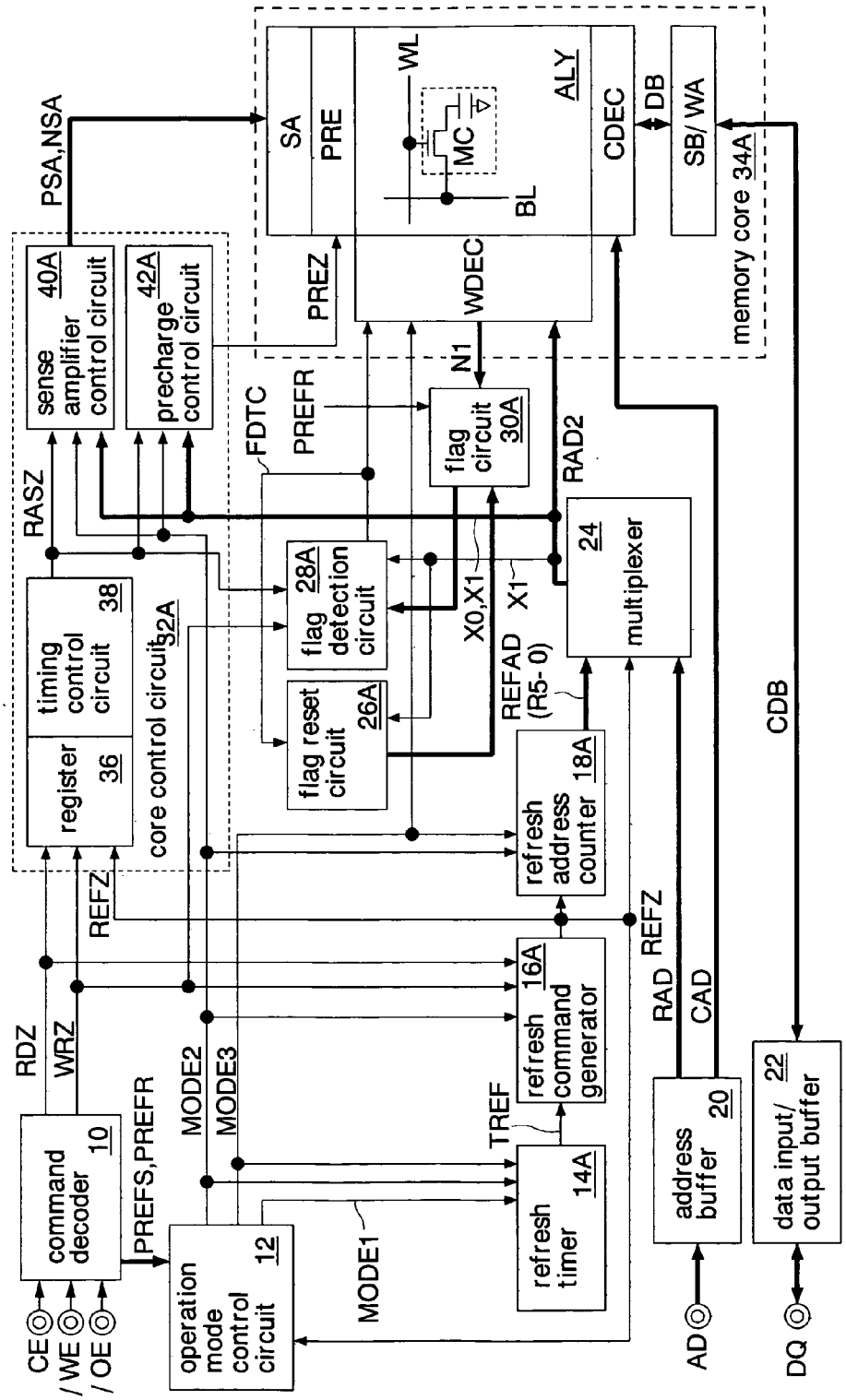
FIG. 31 is a block diagram showing a second embodiment of the semiconductor memory of the present invention.

FIG. 31 shows a second embodiment of the semiconductor memory of the present invention. The same reference numerals or symbols are used to designate the same elements as the elements described in the first embodiment, and detailed description thereof will be omitted.

In this embodiment, in place of the refresh timer 14, the refresh command generator 16, the refresh address counter 18, the flag reset circuit 26, the flag detection circuit 28, the flag circuits 30, the core control circuit 32, and the memory core 34 of the first embodiment, a refresh timer 14A, a refresh command generator 16A, a refresh address counter 18A, a flag reset circuit 26A, a flag detection circuit 28A, a flag circuit 30A, a core control circuit 32A, and a memory core 34A are formed. A sense amplifier control circuit 40A and a precharge control circuit 42A of the core control circuit 32A receive two low-order bits X1, X0 of a row address signal RAD outputted from a multiplexer 24. The other configuration is substantially the same as that of the first embodiment.

Figure 32:
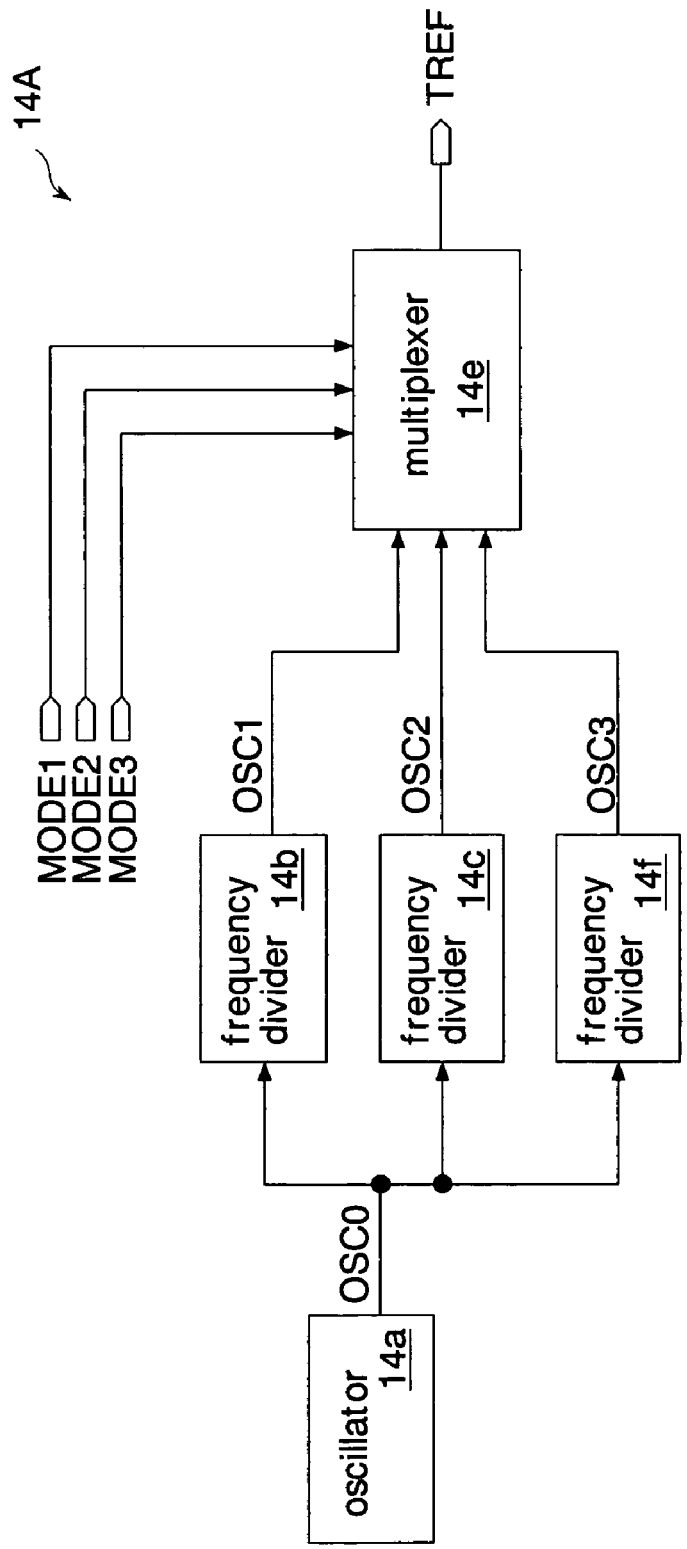
FIG. 32 is a block diagram showing details of a refresh timer shown in FIG. 31.

FIG. 32 shows details of the refresh timer 14A shown in FIG. 31.

Frequency dividers 14b, 14c, 14f of the refresh timer 14 convert a frequency of an OSC0 signal to one eighth, one sixteenth, and one sixty-fourth, respectively.

Figure 33:
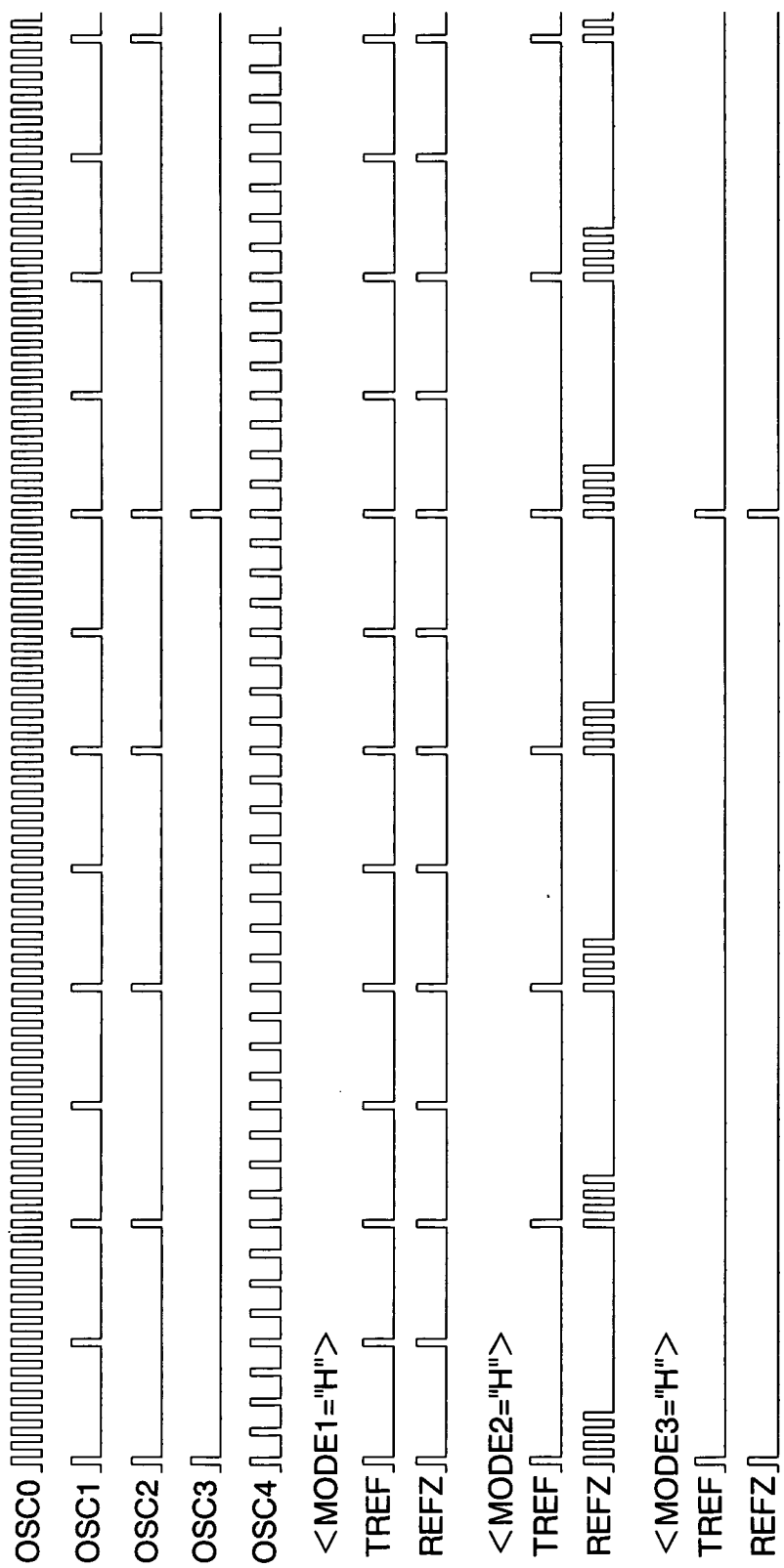
FIG. 33 is a timing chart showing operations of the refresh timer and a refresh command generator in the second embodiment.

FIG. 33 shows operations of the refresh timer 14A and the refresh command generator 16A The refresh timer 14A outputs an oscillation signal OSC1, OSC2, or OSC3 as a refresh request signal TREF when mode signal MODE1, MODE2, or MODE3 is high level, respectively. The refresh command generator 16A outputs the refresh request signal TREF as a refresh control signal REFZ when the mode signal MODE1 or MODE3 is at high level. The refresh command generator 16A outputs the refresh control signal REFZ four times in synchronization with the refresh request signal TREF when the mode signal MODE2 is at high level.

Figure 34:
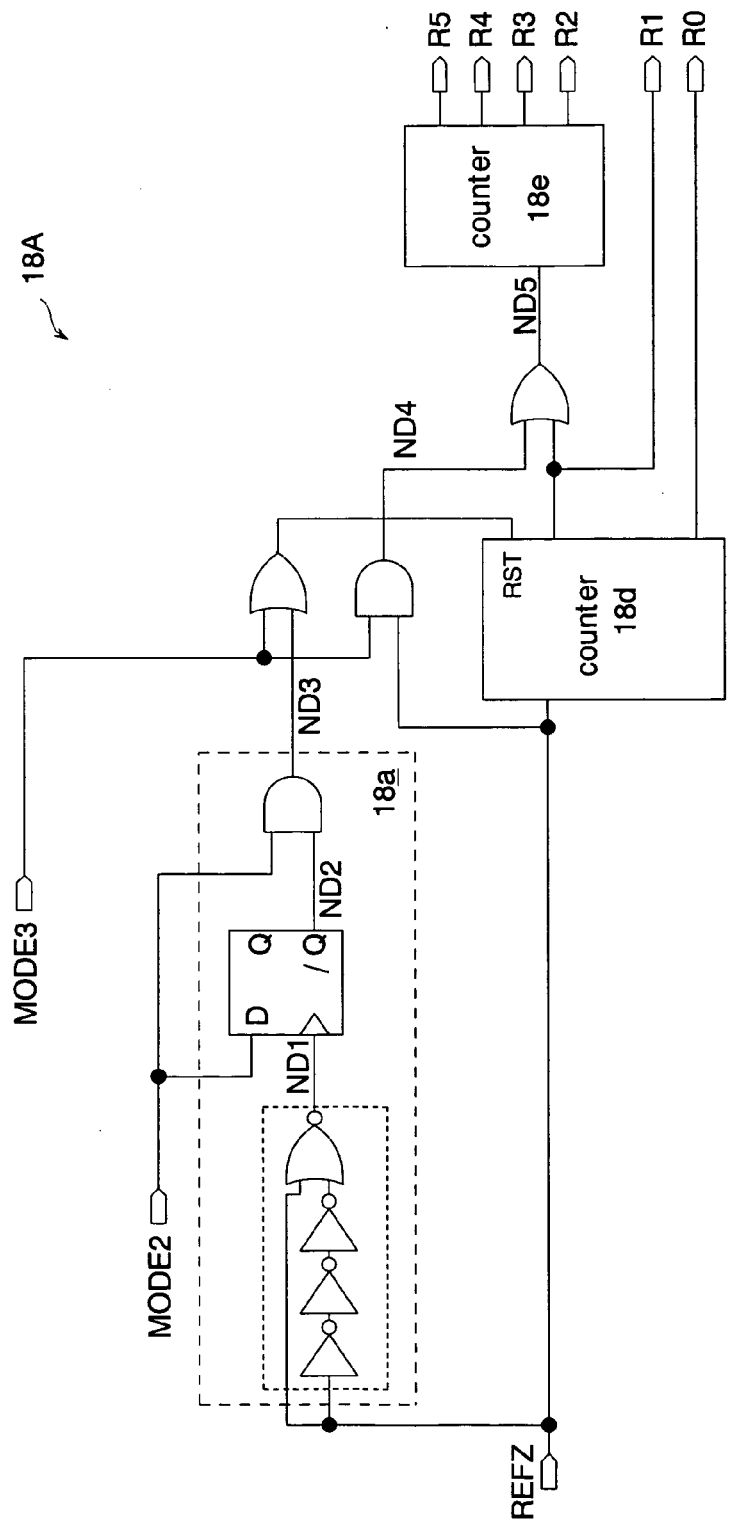
FIG. 34 is a block diagram showing details of a refresh address counter shown in FIG. 31.

FIG. 34 shows details of the refresh address counter 18A shown in FIG. 31.

The refresh address counter 18A has a reset circuit 18a, counters 18d, 18e, and a logic gate controlling the counters 18d, 18e. The counter 18d performs a counting operation in synchronization with the refresh control signal REFZ and generates two low-order bits R1, R0 of the refresh address signal REFAD. The counter 18d is reset in synchronization with a rising edge of the mode signal MODE2 when the mode signal MODE3 is at high level.

When the mode signal MODE3 is at high level, the counter 18e performs a counting operation in synchronization with the refresh control signal REFZ and updates the four high-order bits R5-2 of the refresh address signal REFAD. When the mode signal MODE1 or MODE2 is at high level (excluding a predetermined period after a rising edge of the mode signal MODE2), the counter 18e performs a counting operation in synchronization with the address signal R1 outputted from the counter 18d.

FIG. 35 shows operations of the refresh address counter 18A shown in FIG. 34.

When the mode signal MODE1 or MODE2 is at high level, the refresh address counter 18A sequentially counts up the 6 bits R5-0 of the refresh address signal in synchronization with the refresh control signal REFZ. Further, when the mode signal MODE3 is at high level, the refresh address counter 18A sequentially counts up the 4 bits R5-2 of the refresh address signals in synchronization with the refresh control signal REFZ. At this time, the refresh address signals R1, R0 are fixed to low level.

Figure 36:
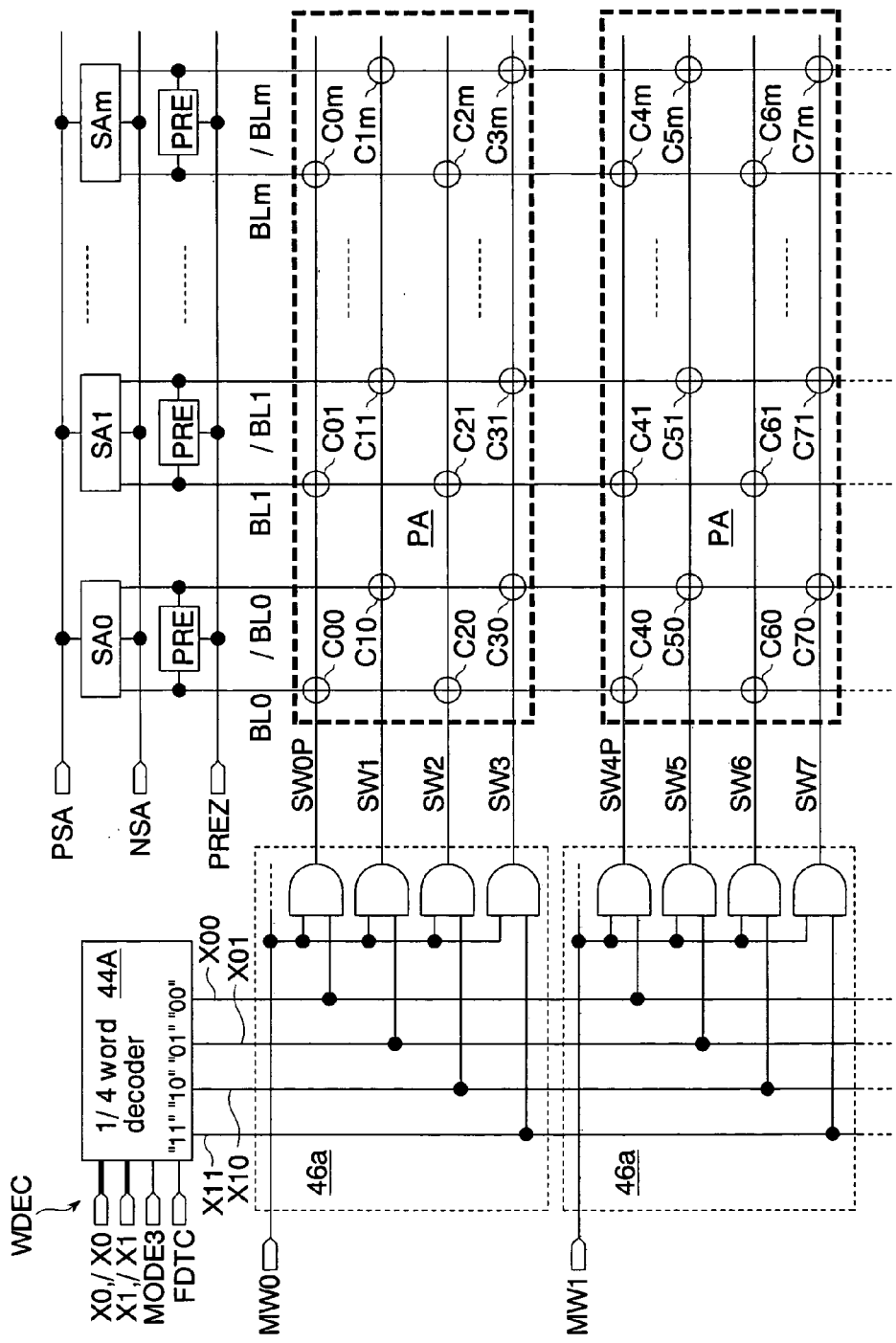
FIG. 36 is a block diagram showing details of an essential part of a memory core shown in FIG. 31.

FIG. 36 shows details of an essential part of the memory core 34A shown in FIG. 31.

A word decoder WDEC of the memory core 34A has a ¼ word decoder 44A and a plurality of sub word decoders 46a corresponding to main word lines MW (MW0, MW1, . . . ), respectively. When the mode signal MODE3 is at low level, the ¼ word decoder 44A outputs one of decode signals X11, X10, X01, X00 according to the two low-order bits X1, X0 of the row address signal RAD2 and invert bits /X1, X0 thereof. When the mode signal MODE3 is at high level, the ¼ word decoder 44A sets all the decode signals X11, X10, X01, X00 to high level.

In this embodiment, memory cells (C00, C10, C20, C30, . . . ) connected to four adjacent sub word lines (for example, SW0P, SW1, SW2, SW3) constitute each partial area PA. For example, the sub word line SWP0 is a partial word line connected to the partial memory cell C00 whose data is retained during a data retention mode. The sub word lines SW1, SW2, SW3 are common word lines connected to the common memory cells C10, C20, C30 whose data are not retained during the data retention mode.

The partial memory cell C00 and the common memory cell C20 are connected to a bit line BL0, and the common memory cells C10, C30 are connected to a bit line /BL0. The partial word line SWP0 and the common word lines SW1, SW2, SW3 are selected in synchronization with each other during the data retention mode, so that the four memory cells are concurrently accessed (second memory mode, quad cell operation). Then, data retained in the partial memory cell C00 during the normal operation mode is retained by the four memory cells C00, C10, C20, C30 during the data retention mode.

In this embodiment, a quarter of the memory cells MC formed in the memory core 34A are the partial memory cells. That is, data corresponding to a quarter of a memory capacity of the pseudo SRAM are retained during the data retention mode.

Figure 37:
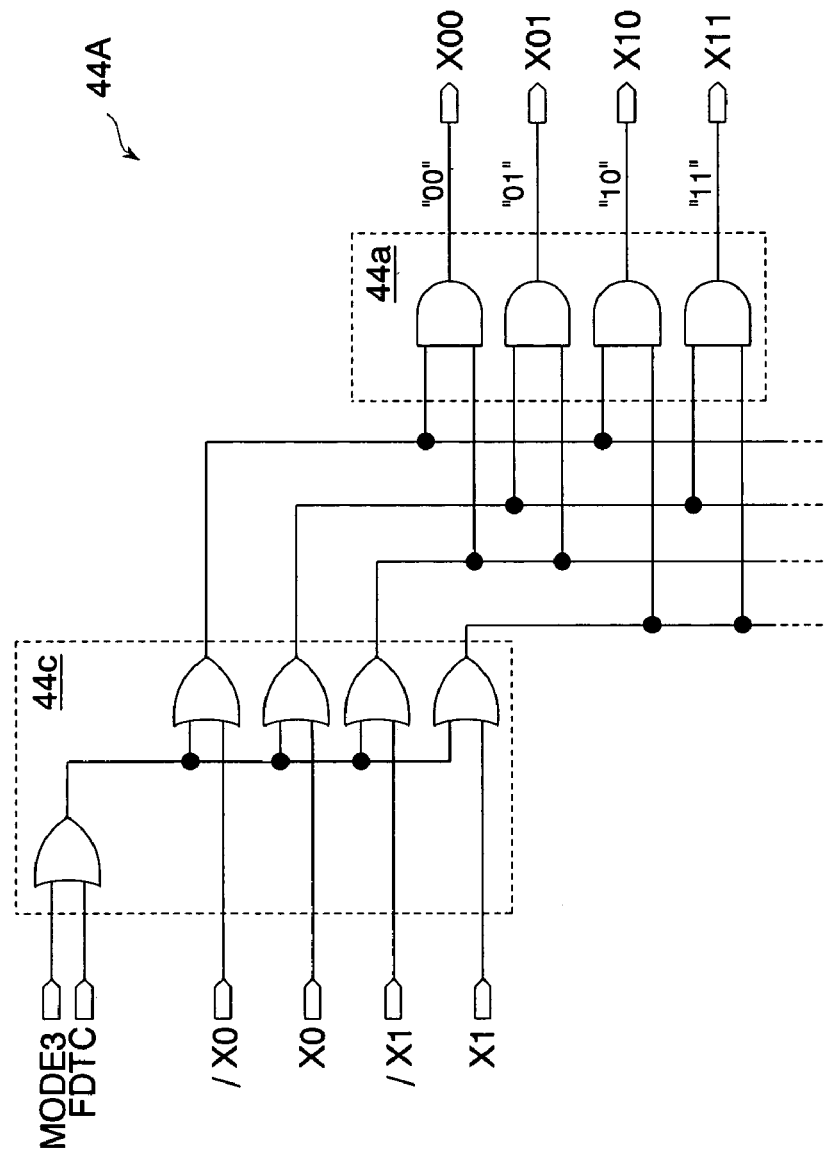
FIG. 37 is a circuit diagram showing details of a ¼ word decoder shown in FIG. 36.

FIG. 37 shows details of the ¼ word decoder 44A shown in FIG. 36.

The ¼ word decoder 44A has a decoder 44a that decodes row address signals X0, /X0, X1, /X1 in order to generate the decode signals X11, X10, X01, X00, and a mask circuit 44c that masks the row address signals X0, /X0, X1, /X1 to output high level to the decoder 44a when the mode signal MODE3 or a flag detection signal FDTC is at high level.

Figure 38:
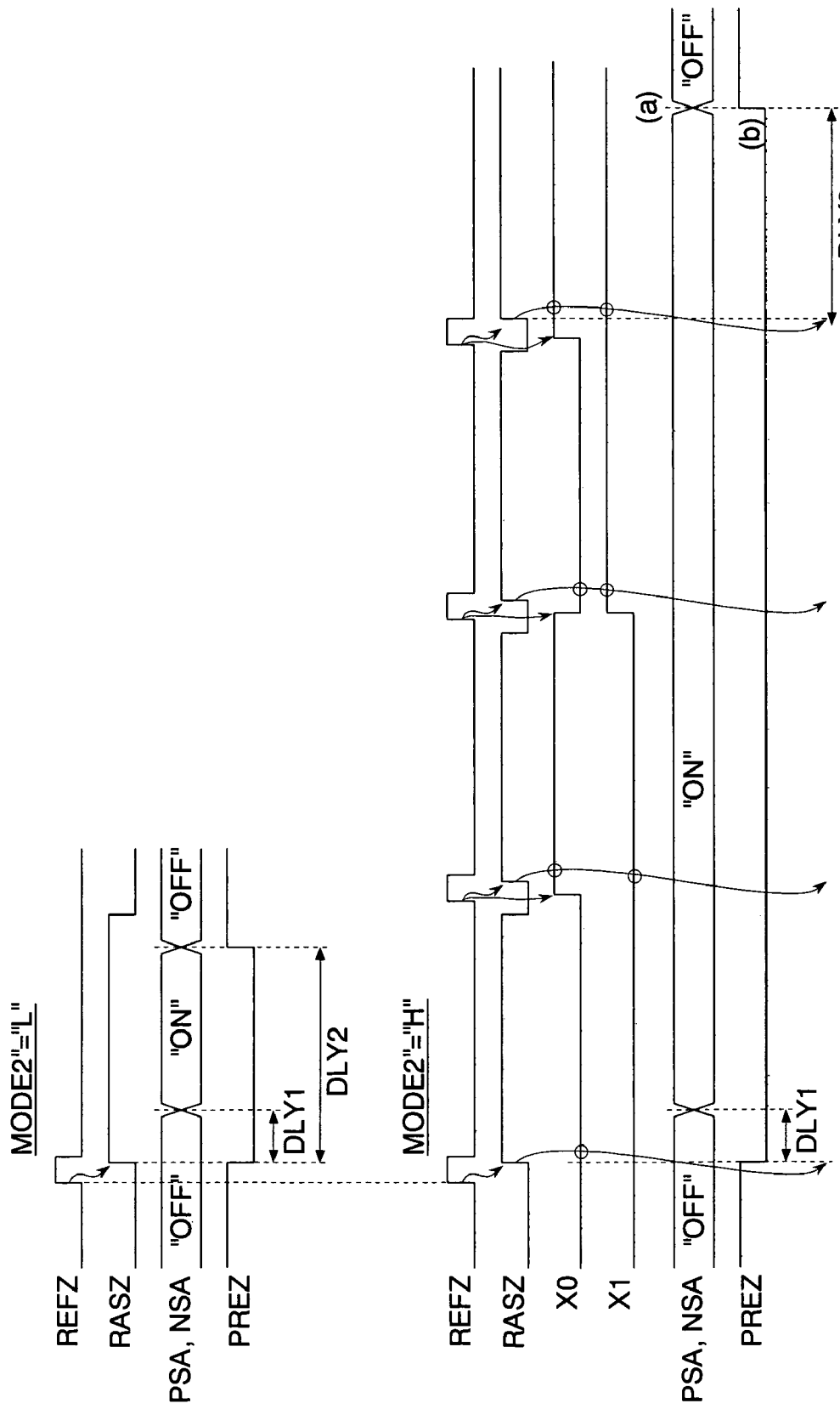
FIG. 38 is a timing chart showing operations of a sense amplifier control circuit and a precharge control circuit shown in FIG. 31.

FIG. 38 shows operations of the sense amplifier control circuit 40A and the precharge control circuit 42A shown in FIG. 31. An operation when the mode signal MODE2 is at low level and an operation when the mode signal MODE2 changes to high level are the same as those in the first embodiment (FIG. 12).

When the mode signal MODE2 is at high level, the sense amplifier control circuit 40A changes sense amplifier activation signals PSA, NSA after a delay time DLY2 from a rising edge of a RASZ signal after the row address signals X1, X0 both change to high level, and deactivates the sense amplifier SA (FIG. 38(a)). When the mode signal MODE2 is at high level, the precharge control circuit 42A changes a precharge signal PREZ to high level after a delay time DLY2 from the rising edge of the RASZ signal after the row address signals X1, X0 both change to high level, and starts a precharge operation (FIG. 38(b)).

Therefore, during a common refresh mode, the sense amplifier SA is kept activated and the precharge of the bit lines BL, /BL is prohibited while the RASZ signal is outputted four times in order to write data retained in the partial memory cell C00 to the partial memory cell and the adjacent common memory cells C10, C20, C30.

Figure 39:
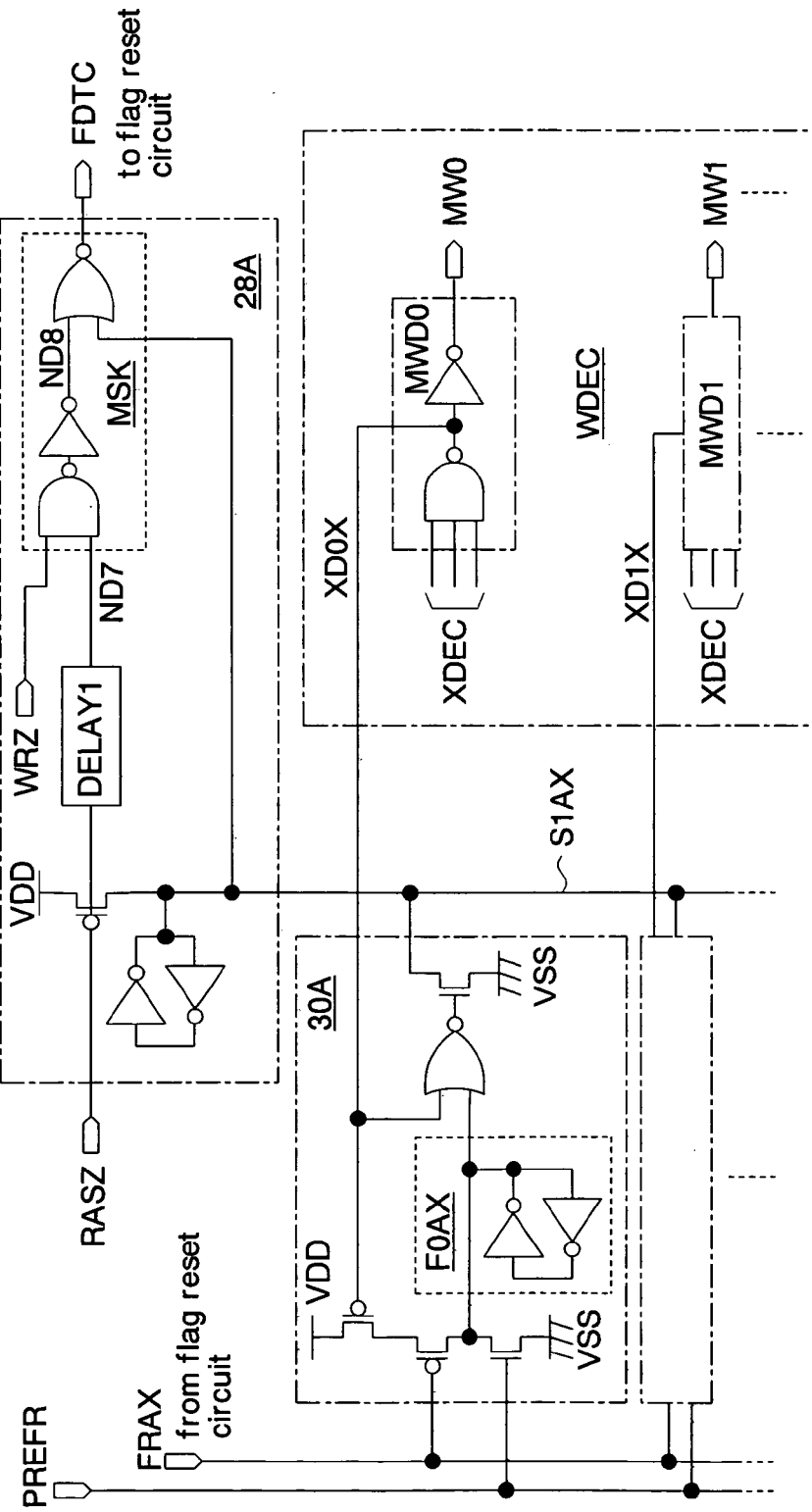
FIG. 39 is a circuit diagram showing details of a flag circuit and a flag detection circuit and an essential part of a word decoder, which are shown in FIG. 31.

FIG. 39 shows details of the flag circuit 30A and the flag detection circuit 28A and an essential part of the word decoder WDEC, which are shown in FIG. 31. The word decoder WDEC is the same as that of the first embodiment (FIG. 13).

The flag circuit 30A is formed for each main word line MW (MW0, MW1, . . . ). Each of the flag circuits 30A has the same flag FAX (F0AX, F1AX, . . . ) as that of the flag circuit 30 of the first embodiment. The function of the flags FAX is the same as that of the first embodiment. Specifically, each of the flags FAX is set to low level in synchronization with a pulse of a partial mode release signal PREFR, and is reset to high level in synchronization with a flag reset signal. The state of the flag FAX is outputted as a flag output signal S1AX in synchronization with the decode signal XDX (XD0X, XD1X, . . . ).

The flag detection circuit 28A has a latch circuit connected to a flag output signal line S1AX, a delay circuit DELAY1, and a mask circuit MSK. The mask circuit MSK outputs the flag output signal S1AX as the flag detection signal FDTC, and has a function of shortening an activation period of the flag detection signal FDTC when a write command is supplied.

Operations of the flag circuit 30A and the flag detection circuit 28A are the same as the operations responding to the flag F0AX in the first embodiment, and therefore description thereof will be omitted.

Figure 40:
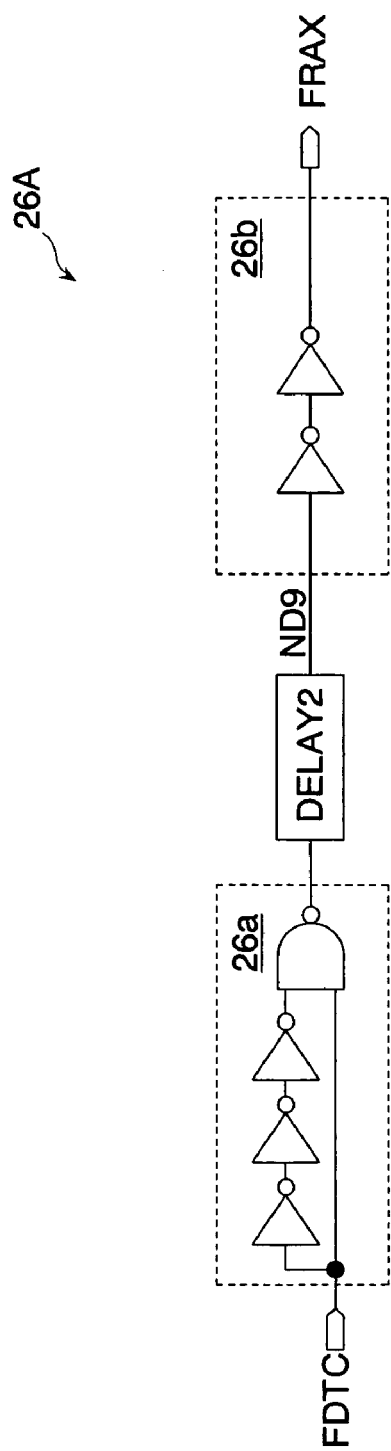
FIG. 40 is a circuit diagram showing details of a flag reset circuit shown in FIG. 31.

FIG. 40 shows details of the flag reset circuit 26A shown in FIG. 31.

The flag reset circuit 26A has a buffer circuit 26b in place of the multiplexer MUX2 of the flag reset circuit 26 (FIG. 18) in the first embodiment. The other configuration is the same as that of the flag reset circuit 26. The flag reset circuit 26A outputs a flag reset signal FRAX after a predetermined period of time from a rising edge of the flag detection signal FDTC.

Figure 41:
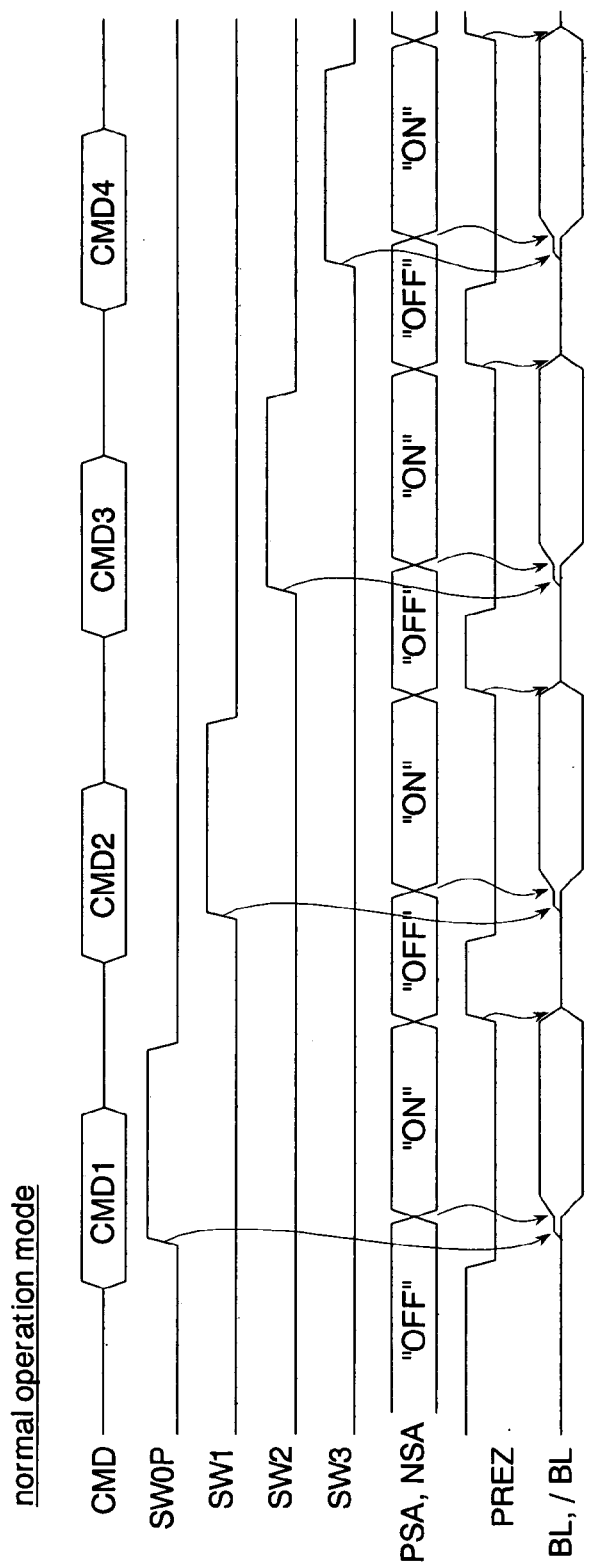
FIG. 41 is a timing chart showing operations during a normal operation mode in the second embodiment.

FIG. 41 shows operations during a normal operation mode in the second embodiment.

In the normal operation mode, similarly to the first embodiment (FIG. 20), the word lines SW0P, SW1, SW3, SW4 are independently selected according to a row address signal RAD2. Then, in response to an external read command or write command, a read operation or a write operation is executed. A refresh operation is executed in response to a refresh command internally generated in the pseudo SRAM.

Figure 42:
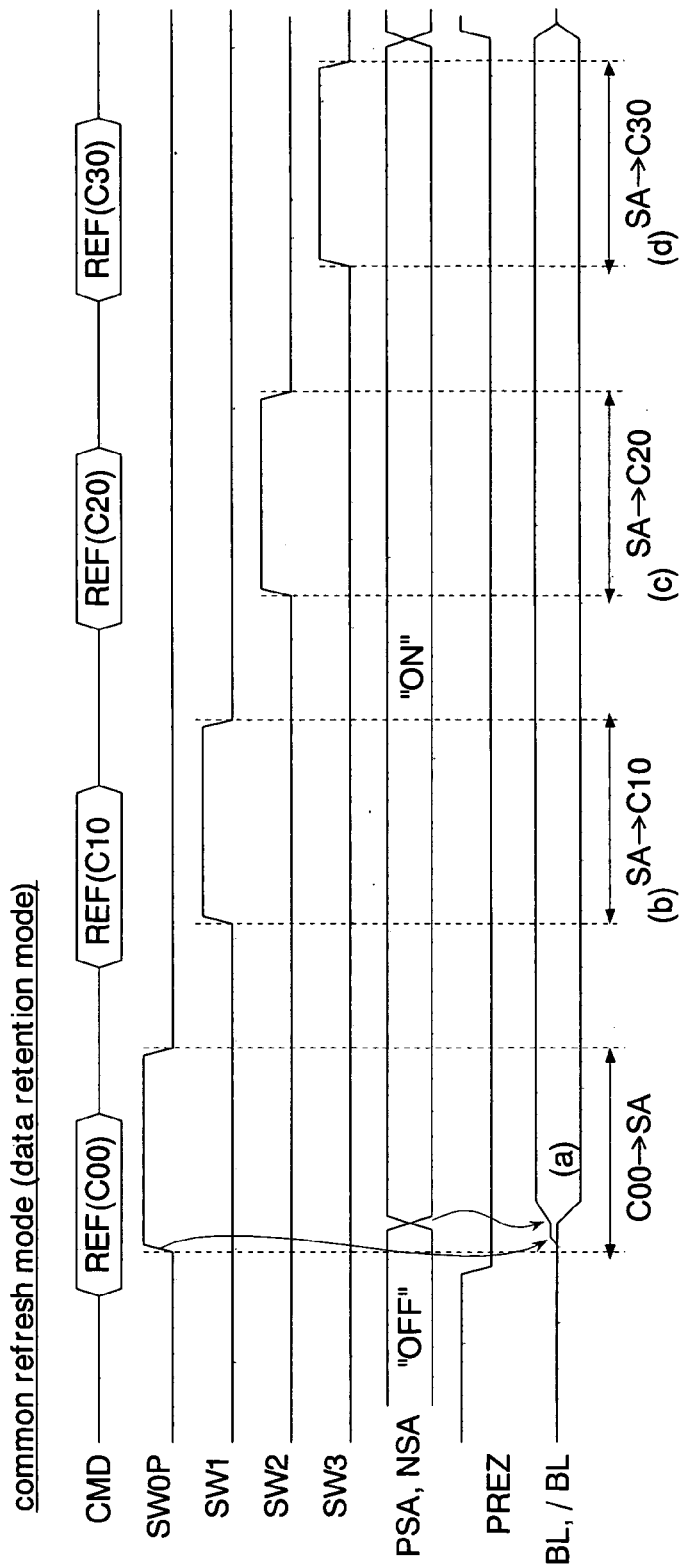
FIG. 42 is a timing chart showing operations during a common refresh mode in the second embodiment.

FIG. 42 shows operations during a common refresh mode in the second embodiment.

In the common refresh mode, data retained in the partial memory cell C00 is first latched in the sense amplifier SA (FIG. 42(a)). Next, while the sense amplifier SA is kept activated, the common memory cells C10, C20, C30 are sequentially accessed and the data latched in the sense amplifier SA (complementary data) is written to these memory cells C10, C20, C30 (FIG. 42(b, c, d)). Consequently, the complementary data are retained in the partial memory cell C00 and the common memory cells C10, C20, C30. The above operations are executed for all the partial areas PA.

Figure 43:
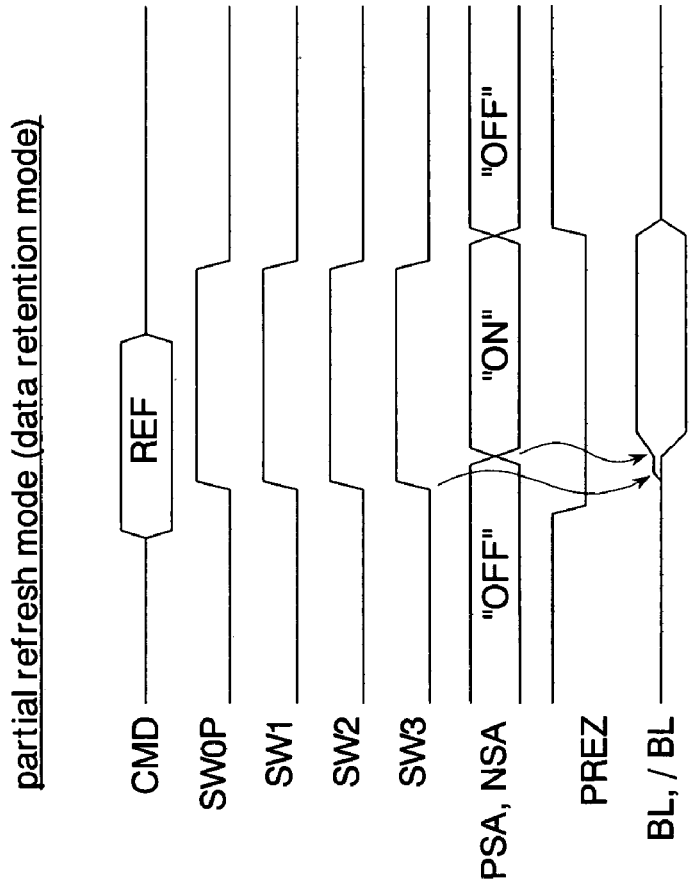
FIG. 43 is a timing chart showing operations during a partial refresh mode in the second embodiment.

FIG. 43 shows operations during a partial refresh mode in the second embodiment.

In the partial refresh mode, the partial word line SW0P and the common word lines SW1, SW2, SW3 are concurrently selected, and the complementary data retained in the partial memory cell C00 and the common memory cells C10, C20, C30 are concurrently amplified by the sense amplifier SA and are written back to the cells C00, C10, C20, C30 (quad cell operation). The complementary data are retained in the partial memory cell C00 and the common memory cells C10, C20, C30, so that a refresh cycle can be further lengthened than that of the first embodiment.

This embodiment described above can also provide the same effects as those of the aforesaid first embodiment. In addition, in this embodiment, data retained in the single partial memory cell C00 is retained in the partial memory cell C00 and the common memory cells C10, C20, C30 during the data retention mode, so that the retention time during which the data is retainable can be further lengthened. This can further reduce the frequency of the refresh operation, so that power consumption during the data retention mode can be greatly reduced.

The foregoing embodiments have described the examples where the present invention is applied to the pseudo SRAM, but the present invention is not limited to such embodiments. For example, the present invention may be applied to a DRAM having a self-refresh function.

The foregoing embodiments have described the examples where the CE signal, the /WE signal, and the /OE signal are used as the command signal. However, the present invention is not limited to such embodiments. For example, a row address strobe signal /RAS and a column address strobe signal /CAS may be used as a command signal as in a DRM.

The foregoing embodiments have described the examples where the operation mode is set to the data retention mode (low power consumption mode) when the chip enable signal CE is at low level. The present invention is not limited to such embodiments. For example, such a design is also acceptable that two chip enable signals /CE1, CE2 are received via the external terminal, the normal read operation and write operation are executable when the /CE1 signal is at low level as well as the CE2 signal is at high level, and the operation mode is set to the data retention mode when the CE2 signal is at low level.

The invention is not limited to the above embodiments and various modifications may be made without departing from the spirit and scope of the invention. Any improvement may be made in part or all of the components.

What is claimed is:

1. A semiconductor memory comprising:
   a plurality of volatile memory cells;
   a plurality of word lines connected to said memory cells, respectively;
   a plurality of memory cell groups each constituted of said memory cells connected to a predetermined number of said word lines, respectively;
   a control circuit executing operations of a first memory mode and a second memory mode, the first memory mode being a mode in which each of the memory cells independently retains data and the second memory mode being a mode in which each of the memory cells in each of said memory cell groups retain same data;
   a plurality of flags corresponding to said memory cell groups, respectively, and indicating as a set state that said memory cells store data in the second memory mode; and
   a flag reset circuit that, in a changing operation of changing states of all of said memory cells from the second memory mode to the first memory mode, resets each of said flags in response to a first access to a corresponding memory cell group among said memory cell groups.

2. The semiconductor memory according to claim 1, further comprising
   a flag set circuit setting all said flags prior to the changing operation.

3. The semiconductor memory according to claim 1, further comprising
   a flag detection circuit that, when the memory cell is accessed, detects whether or not the corresponding flag is set, wherein
   said control circuit executes the operation of one of the first memory mode and the second memory mode according to a result of the detection by said flag detection circuit.

4. The semiconductor memory according to claim 1, wherein
   when the first access is a write operation, said control circuit reads data from all of said memory cells of the memory cell group to write back the read data to all of said memory cells, and writes data to one of said memory cells designated as a write target.

5. The semiconductor memory according to claim 4, further comprising:
   bit lines connected to said memory cells; and
   a sense amplifier connected to said bit lines, wherein
   said control circuit keeps said sense amplifier activated while data is read from, written back to, and written to said memory cells.

6. The semiconductor memory according to claim 5, further comprising
   a word control circuit that makes the word line unselected while said sense amplifier is activated, said word line being connected to the memory cell in the memory cell group except the memory cell designated as the write target.

7. The semiconductor memory according to claim 1, wherein
   when the first access is a read operation, said control circuit reads data from all of said memory cells of the memory cell group to output the read data to an external part of the semiconductor memory and writes back the read data to said memory cells.

8. The semiconductor memory according to claim 1, wherein
when the first access is a refresh operation, said control circuit reads data from all of said memory cells of the memory cell group to write back the read data to said memory cells.

9. The semiconductor memory according to claim 1, further comprising:
a normal operation mode in which the semiconductor memory operates according to an externally supplied access command and an internally generated refresh command; and
a data retention mode in which the semiconductor memory operates according only to the refresh command, wherein
data is stored in the first memory mode during the normal operation mode, and is stored in the second memory mode during the data retention mode, and
in a changing operation from the data retention mode to the normal operation mode, the memory cell in the first memory mode and the memory cell in the second memory mode concurrently exist.

10. The semiconductor memory according to claim 9, wherein:
said memory cells of the memory cell group include a partial memory cell storing data that is retained during the second memory mode; and
after shifting from the normal operation mode to the data retention mode, said control circuit executes, every time the refresh command is generated, a common refresh operation of reading data stored in the partial memory cell to write the read data to all of said memory cells of the memory cell group until the states of all of said memory cell groups shift to the second memory mode.

11. The semiconductor memory according to claim 1, wherein:
the single memory cell connected to the single word line retains one-bit data in the first memory mode; and
all of said memory cells of the memory cell group retain the data in the second memory mode.

* * * * *